US008836376B2

(12) United States Patent
Danjo

(10) Patent No.: US 8,836,376 B2
(45) Date of Patent: Sep. 16, 2014

(54) COMPARATOR AND A/D CONVERTER

(71) Applicant: Fujitsu Limited, Kawasaki (JP)

(72) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/012,746

(22) Filed: Aug. 28, 2013

(65) Prior Publication Data

US 2014/0132437 A1   May 15, 2014

(30) Foreign Application Priority Data

Nov. 12, 2012 (JP) .................................. 2012-248579

(51) Int. Cl.
*H03K 5/24* (2006.01)
*H03K 3/0233* (2006.01)
*H03M 1/36* (2006.01)

(52) U.S. Cl.
CPC ............. *H03K 3/0233* (2013.01); *H03M 1/361* (2013.01); *H03K 5/2445* (2013.01)
USPC ................. 327/65; 327/55; 341/118; 341/159

(58) Field of Classification Search
CPC ... H03K 5/082; H03K 5/2426; H03K 5/2428; G11C 7/062; G11C 7/065; H03M 1/34
USPC ...................... 327/55, 57, 65, 67, 77, 89, 208; 341/118, 158, 159
See application file for complete search history.

(56) References Cited

U.S. PATENT DOCUMENTS 6,157,222 A   12/2000   Yaklin
6,366,113 B1   4/2002   Song
(Continued)

FOREIGN PATENT DOCUMENTS

JP   07-193442 A   7/1995
JP   10-65542 A   3/1998
(Continued)

OTHER PUBLICATIONS

Goll et al., A Low-Power 4GHz Comparator in 120nm CMOS Technology with a Technique to tune Resolution, IEEE, Proceedings of the 32nd European Solid-Circuits Conference, 2008, Sep. 2008, pp. 320-323.*

(Continued)

*Primary Examiner* — Howard Williams
(74) *Attorney, Agent, or Firm* — Arent Fox LLP

(57) ABSTRACT

A comparator includes: a differential amplifier of which operational state is switched in response to a clock-signal, and which outputs a first intermediate-output corresponding to a first input-signal and a second intermediate-output corresponding to a second input-signal; a differential latch circuit of which operational state is switched in response to the clock-signal, and a state of which is changed depending on the first intermediate-output and the second intermediate-output; a first adjuster configured to adjust a threshold of the differential latch circuit with respect to a change of a state of the first intermediate-output and a change of a state of the second intermediate-output; and a second adjuster configured to adjust a threshold variation of the differential latch circuit with respect to a change of a state of the first intermediate-output and a change of a state of the second intermediate-output.

16 Claims, 34 Drawing Sheets

(56) References Cited

U.S. PATENT DOCUMENTS

| 7,265,701 | B2 | 9/2007 | Ishii | |
|---|---|---|---|---|
| 8,362,934 | B2 | 1/2013 | Matsuzawa et al. | |
| 2003/0132779 | A1 | 7/2003 | Yoo et al. | |
| 2009/0302935 | A1* | 12/2009 | Iwata et al. | 329/300 |
| 2010/0243768 | A1 | 9/2010 | Yano et al. | |
| 2010/0328120 | A1* | 12/2010 | Van der Plas et al. | 341/110 |
| 2011/0215959 | A1* | 9/2011 | Matsuzawa et al. | 341/160 |
| 2013/0176156 | A1* | 7/2013 | Danjo | 341/155 |

FOREIGN PATENT DOCUMENTS

| JP | 2000-307391 A | 11/2000 |
|---|---|---|
| JP | 2001-223754 A | 8/2001 |
| JP | 2003-273938 A | 9/2003 |
| JP | 2006-270726 A | 10/2006 |
| JP | 2010-109937 A | 5/2010 |
| JP | 2010-223553 A | 10/2010 |

OTHER PUBLICATIONS

Milovanovic et al., A Fully Complementary and Fully Differential Self-Biased Asynchronous CMOS Comparator, 2012 19th IEEE International Conference on Electronics, Circuits and Systems (ICECS), Dec. 2012, pp. 605-608.*

Sumanen et al., A Mismatch Insensitive CMOS Dynamic Comparator for Pipeline A/D Converters, The 7th IEEE International Conference on Electronics, Circuits and Systems, 2000. ICECS 2000, Dec. 2000.*

Koon-Lun Jackie Wong et al., Offset Compensation in Comparators With Minimum Input-Referred Supply Noise, IEEE Journal of Solid-State Circuits, vol. 39, No. 5, May 2004, pp. 837-840.*

Daniel Schinkel et al., "A Double-Tail Latch-Type Voltage Sense Amplifier with 18ps Setup+Hold Time", IEEE, ISSCC 2007, Dig. of Tech., pp. 314-315.

* cited by examiner

COMPARATOR AND A/D CONVERTER

CROSS-REFERENCE TO RELATED APPLICATION

This application is based upon and claims the benefit of priority from the prior Japanese Patent Application No. 2012-248579 filed on Nov. 12, 2012, the entire contents of which are incorporated herein by reference.

FIELD

The embodiments discussed herein are related to a comparator and an analog-to-digital (A/D) converter.

BACKGROUND

A comparator that compares voltage levels of two input signals and outputs a comparison result is used widely. For example, a flash A/D converter includes multiple comparators. A 4-bit flash A/D converter, for example, includes at least 15 comparators. For the conversion of high frequency analog signals into digital signals, speeding-up of a flash A/D converter has been desired and, accordingly, a comparator which performs a high-speed operation has been desired.

Although a dynamic latch comparator is used as a comparator which performs a high-speed operation, a two-stage dynamic latch comparator has been proposed for further speeding-up and for reduction in electricity.

It is known that, in the process of fabricating a comparator, an offset due to variations in production or asymmetrical layout of transistors constituting the comparator exists and adversely affects a circuit operation. Then, various correction techniques to set the offset at zero have been studied. There is a desire of not only setting the offset at zero but also setting a threshold (an input voltage difference at which outputs are inverted) of the comparator at another value except zero without generating reference voltage. If the offset is adjustable, it is possible to set the threshold at a desired value.

Then, a technology is proposed in which an adjuster including a charge pump, a switch, and a capacitor is given from outside at a gate of a transistor forming an input differential pair in the two-stage dynamic latch comparator so that a threshold of the input differential pair is adjustable. It is also proposed that, in the two-stage dynamic latch comparator, a threshold of the comparator is made adjustable by connecting a variable capacitor to a signal node from a first stage to a second stage and adjusting a load of signal change.

However, a threshold variation is affected by corner conditions, temperature, power supply voltage, and the like of a transistor fabricating process. Recently, operating voltage is lowered to a value near the operating limit in order to reduce power consumption. However, with such low operating voltage, a threshold variation becomes relatively large and, therefore, the threshold variation does not necessarily take a desired value.

Japanese Laid-open Patent Publication No. 2010-109937, Japanese Laid-open Patent Publication No. 2010-223553, Japanese Laid-open Patent Publication No. 10-065542, Japanese Laid-open Patent Publication No. 2000-307391, Japanese Laid-open Patent Publication No. 2006-270726, Japanese Laid-open Patent Publication No. 2001-223754, Japanese Laid-open Patent Publication No. 2003-273938, Japanese Laid-open Patent Publication No. 7-193442, and D. Schinkel, E. Mensink, E. Klumperink, E. Van Tuiji and B. Nauta: "A Double-Tail Latch Type Voltage Sense Amplifier with 18 ps Setup+Hold Time", IEEE, ISSCC 2007, Dig. Of Tech. Paper, pp. 314-315, February 2007 are examples of the related art.

Regarding making the threshold of the input differential pair be adjustable, the comparator described above has the following problems. Since an adjuster is connected from outside, a circuit area becomes large. Since a stationary current is made to flow outside, power consumption is increased. Regarding adjusting a threshold of the comparator, the comparator described above also has the following problems.

Since a capacitor is provided as a load to a current path of a signal, electric power is increased and operation speed is reduced.

Further, if the threshold is changed largely due to corner conditions, temperature, power supply voltage, and the like, a threshold variation exceeds an adjustable range and, therefore, desired setting is not possible.

The embodiments provide a comparator operable with low power consumption at high speed, in which offset is adjustable to zero or a threshold is settable at a desired level, and which may be used when a threshold variation is large.

SUMMARY

According to an aspect of the invention, a comparator includes: a differential amplifier of which operational state is switched in response to a clock-signal, and which outputs a first intermediate-output corresponding to a first input-signal and a second intermediate-output corresponding to a second input-signal; a differential latch circuit of which operational state is switched in response to the clock-signal, and a state of which is changed depending on the first intermediate-output and the second intermediate-output; a first adjuster configured to adjust a threshold of the differential latch circuit with respect to a change of a state of the first intermediate-output and a change of a state of the second intermediate-output; and a second adjuster configured to adjust a threshold variation of the differential latch circuit with respect to a change of a state of the first intermediate-output and a change of a state of the second intermediate-output.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Before describing embodiments, a typical dynamic latch comparator and a typical two-stage dynamic latch comparator will be described.

Figure 1:
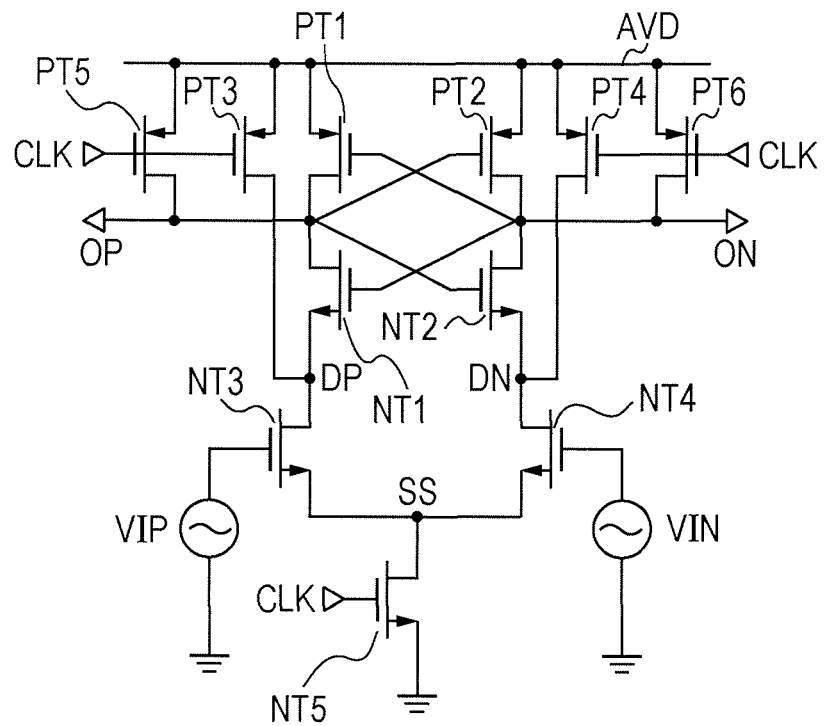
FIG. 1 is a circuit diagram illustrating an example of a typical dynamic latch comparator.

FIG. 1 is a circuit diagram illustrating an example of a typical dynamic latch comparator. In this comparator, a first line in which a PMOS transistor PT1 and an NMOS transistor NT1 are connected in series and a second line in which a PMOS transistor PT2 and an NMOS transistor NT2 are connected in series are arranged in parallel. Gates of PT1 and NT1 are connected to a connection node of PT2 and NT2, from which node an output signal (comparison result) ON is obtained. Gates of PT2 and NT2 are connected to a connection node of PT1 and NT1, from which node an output signal (comparison results) OP is obtained. That is, PT1, PT2, NT1, and NT2 form a latch circuit. The output signal OP and the output signal ON are opposite in phase.

A PMOS transistor PT3 is connected in parallel to the first line and a clock signal CLK is applied to a gate of PT3. A PMOS transistor PT4 is connected in parallel to the second line and CLK is applied to a gate of PT4. A PMOS transistor PT5 is connected in parallel to PT1, that is, connected between an output terminal of an analog high potential power supply AVD and an output terminal of OP, and CLK is applied to a gate of PT5. A PMOS transistor PT6 is connected in parallel to PT2, that is, connected between an output terminal of AVD and an output terminal ON, and CLK is applied to a gate of PT6.

A source of NT1 is connected to a node DP and a source of NT2 is connected to a node DN. An NMOS transistor NT3 is connected between DP and a node SS, and an NMOS transistor NT4 is connected between DN and SS. An NMOS transistor NT5 is connected between SS and an analog low potential power supply GND. Differential input signals VIP and VIN are input in gates of NT3 and NT4, and CLK is applied to a gate of NT5.

When CLK=low (L), PT3, PT4, PT5, and PT6 are turned on (conducted) and DP, DN, OP, and ON are charged to high (H). Further, since NT5 is turned off (blocked), a stationary current does not flow.

When CLK=H, PT3, PT4, PT5, and PT6 are turned off and NT5 is turned on. In this state, NT3 and NT4 are brought into conduction in accordance with the voltages of VIP and VIN. An amount of current flowing differs depending on the voltages of VIP and VIN. When the current flows into NT3 and NT4, DP and DN are discharged: a discharge speed differs depending on the amount of current flowing in NT3 and NT4. With this difference, the latch circuit performs a latch function thereof so that OP is set at H or L and ON is set at vice versa.

The comparator of FIG. 1 is a four-stage circuit in which four MOS transistors are connected in series between AVD and GND. This comparator has a problem that speeding-up is difficult because the voltage applied to the MOS transistors decreases as the stage increases.

Figure 2:
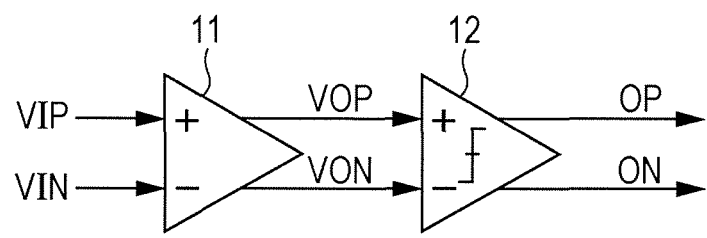
FIG. 2 is a diagram illustrating a circuit in which a preamplifier is arranged in the pre-stage of a comparator.

FIG. 2 illustrates a circuit in which a preamplifier 11 is arranged in a pre-stage of a comparator 12 in order to increase the speed. In the circuit of FIG. 2, the preamplifier 11 amplifies the input signals VIP and VIN and outputs amplified outputs VOP and VON, and the comparator 12 determines the size of the amplified outputs VOP and VON and outputs the comparison results OP and ON. In the circuit of FIG. 2, since voltage difference of the signal input in the comparator 12 becomes large, the speed is increased. However, since a stationary current flows through the typical preamplifier 11, it is difficult to reduce power consumption of the typical preamplifier 11 and thus the circuit of FIG. 2 is not suitable for low power consumption design.

Then, a two-stage dynamic latch comparator in which comparison and amplification are performed in the first stage and latch is performed in the second stage is proposed.

Figure 3:
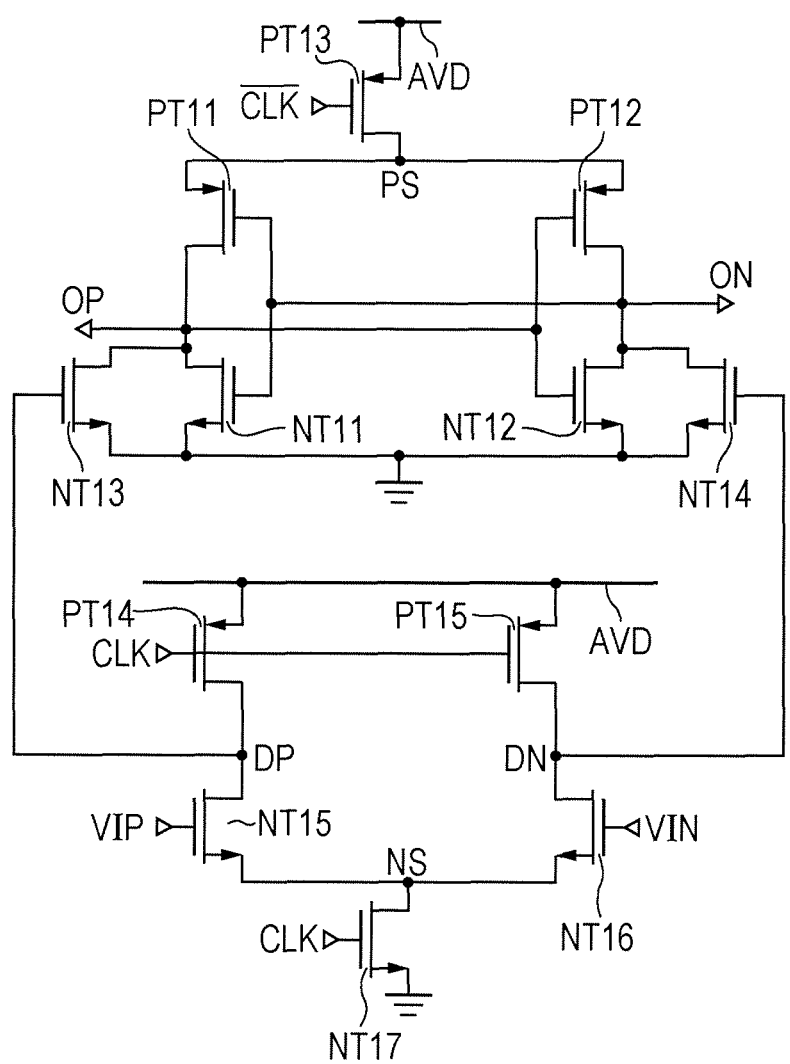
FIG. 3 is a circuit diagram illustrating an example of a two-stage dynamic latch comparator.

FIG. 3 is a circuit diagram illustrating an example of a two-stage dynamic latch comparator. This two-stage dynamic latch comparator includes a first stage portion and a second stage portion. The first stage portion includes, arranged in parallel between AVD and a node NS, a PMOS transistor PT14 and an NMOS transistor NT15 which are connected in series, and a PMOS transistor PT15 and an NMOS transistor NT16 which are connected in series. CLK is applied to gates of PT14 and PT15, an input signal VIP is input in a gate of NT15, and an input signal VIN is input in a gate of NT16. An NMOS transistor NT17 is connected between NS and GND and CLK is applied to a gate of NT17. A signal of a connection node DP of PT14 and NT15 and a signal of a connection node DN of PT15 and NT16 become output signals to the second stage.

In the second stage, PMOS transistors PT11 and PT12 and NMOS transistors NT11 and NT12 form a latch circuit as in FIG. 1. An output signal OP is output from a connection node of PT11 and NT11 and an output signal ON is output from a connection node of PT12 and NT12. Sources of PT11 and PT12 are connected to a node PS. Sources of NT11 and NT12 are connected to GND. A PMOS transistor PT13 is connected between AVD and PS, and /CLK is applied to a gate of PT13. In FIG. 3, /CLK is illustrated with an overbar attached to CLK. An NMOS transistor NT13 is arranged in parallel with NT11 and an NMOS transistor NT14 is arranged in parallel with NT12. A gate of NT13 is connected to DP and a gate of NT14 is connected to DN.

Figure 4:
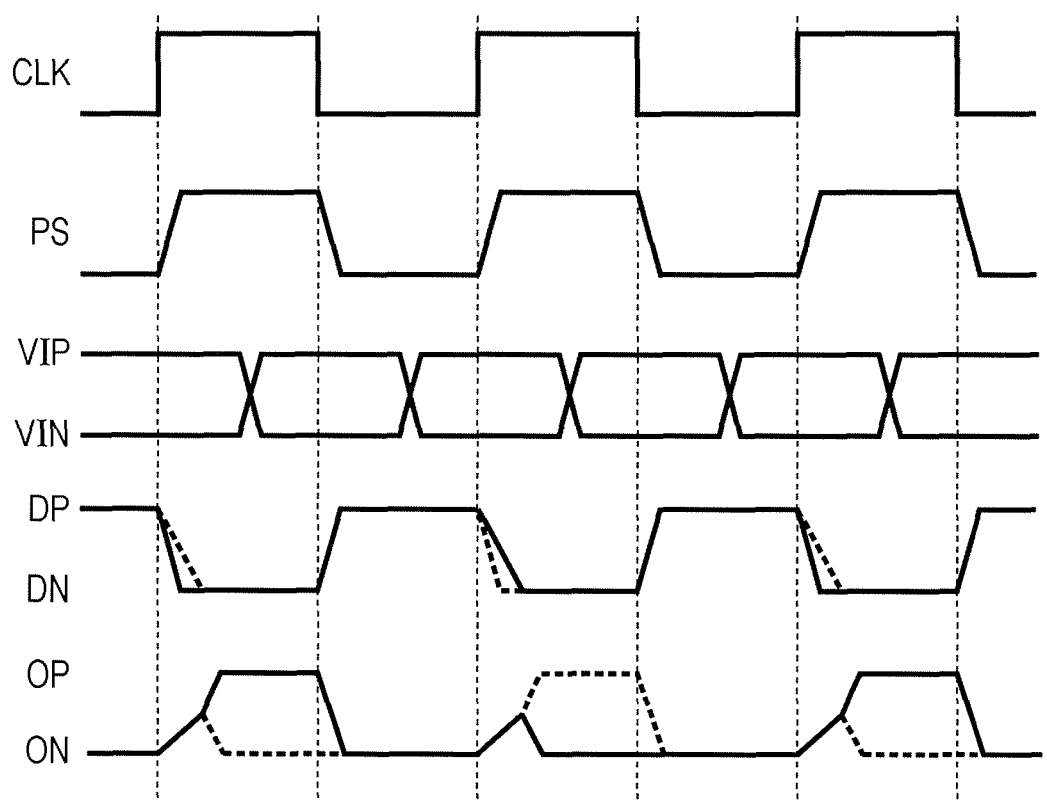
FIG. 4 is a timing diagram illustrating an operation of the two-stage dynamic latch comparator of FIG. 3.

FIG. 4 is a timing diagram illustrating an operation of the two-stage dynamic latch comparator of FIG. 3.

When CLK=L, a circuit of FIG. 3 is in a reset period: DP and DN are fixed to H and PS, OP, and ON are fixed to L.

Once it is turned to be CLK=H, the first stage of the circuit of FIG. 3 starts comparison of VIP and VIN. Then PT14 and PT15 are turned off, NT17 is turned on, and a current in accordance with VIP and VIN begins to flow into NT15 and NT16. Since PT14 and PT15 are turned off, the currents in DP and DN are drawn depending on VIP and VIN, and DP and DN decline toward L. At this time, a difference is made in the currents flowing in NT15 and NT16 depending on VIP and VIN, and DP and DN differ in the rate of decline. In particular, if VIP>VIN, the rate of decline of DP is high, and if VIP<VIN, the rate of decline of DN is high. In FIG. 4, the side in which the rate of decline is high is illustrated by a solid line and the side in which the rate of decline is low is illustrated by a dashed line.

At the same time, in the second stage, it is turned to be /CLK=L, PT13 is turned on, a current begins to flow and charging of OP and ON is started. However, NT13 and NT14 are turned on since DP and DN are applied to the gates thereof and currents are drawn from the nodes of OP and ON, a difference is made in the charge of OP and ON in depending on the rate of decline in DP and DN. When VIP>VIN, since the rate of decline in DP is higher than in DN, NT13 is turned off before NT14 is. Therefore, an amount of current leaking from NT13 decreases and OP is turned to be H before ON is. Since the circuit is a latch circuit, when OP is turned to be H, charging of ON is stopped and ON is turned to be L as illustrated by a dashed line in FIG. 4. When VIP<VIN, an inverse operation is performed.

The two-stage dynamic latch comparator of FIG. 3 is a three-stage circuit: this circuit enables speeding up as compared with the circuit of FIG. 1 and, when it becomes CLK=L after determination of CLK=H, a current does not flow and thus this circuit enables a low power consumption design.

It is known that, in the process of fabricating a comparator, an offset due to variations in production or asymmetrical layout of transistors constituting the comparator exists and adversely affects a circuit operation. Then, various correction techniques to set the offset at zero have been studied. There is a desire of not only setting the offset at zero but also setting a threshold (an input voltage difference at which outputs are inverted) of the comparator at another value except zero without generating reference voltage. If the offset is adjustable, it is possible to set a desired threshold.

Figure 5:
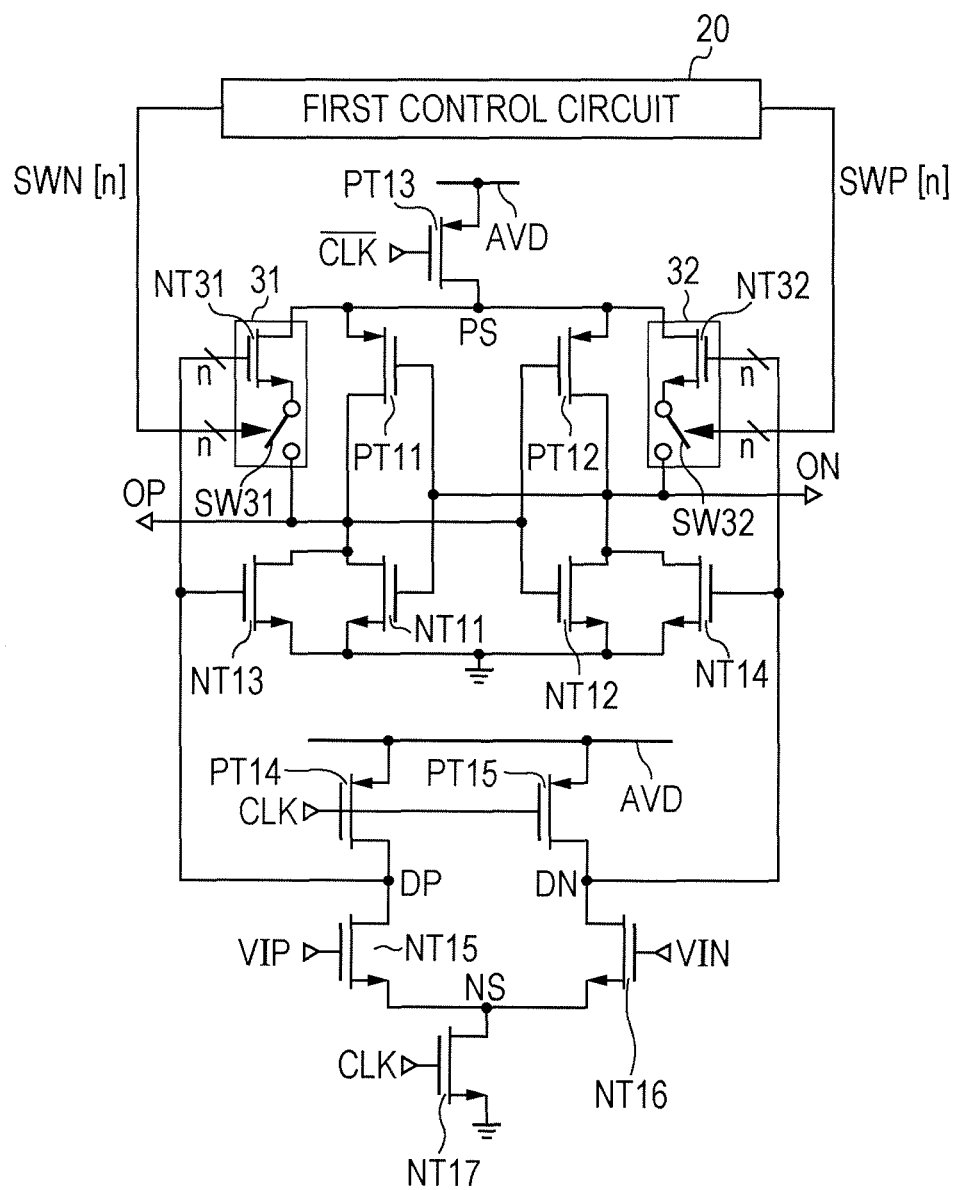
FIG. 5 is a circuit diagram of a two-stage dynamic latch comparator in which offset is adjustable.

FIG. 5 is a circuit diagram of the two-stage dynamic latch comparator illustrated in FIG. 3 in which offset is adjustable. The comparator illustrated in FIG. 5 includes a first stage portion, a second stage portion, and a first control circuit 20. The first stage portion includes, arranged in parallel between AVD and a node NS, a PMOS transistor PT14 and an NMOS transistor NT15 which are connected in series, and a PMOS transistor PT15 and an NMOS transistor NT16 which are connected in series. The line of PT14 and NT15 and the line of PT15 and NT16 are arranged in parallel, and NT15 and NT16 form a differential input pair. CLK is applied to gates of PT14 and PT15, an input signal VIP is input in a gate of NT15, and an input signal VIN is input in a gate of NT16. An NMOS transistor NT17 is connected between NS and GND and CLK is applied to a gate of NT17. A signal of a connection node DP of PT14 and NT15 and a signal of a connection node DN of PT15 and NT16 become output signals to the second stage.

In the second stage, a first line in which a PMOS transistor PT11 and an NMOS transistor NT11 are connected in series and a second line in which a PMOS transistor PT12 and an NMOS transistor NT12 are connected in series are provided in parallel. Gates of PT11 and NT11 are connected to a connection node of PT12 and NT12, from which node an output signal (comparison result) ON is obtained. Gates of PT12 and NT12 are connected to a connection node of PT11 and NT11, from which node an output signal (comparison result) OP is obtained. That is, PT11, PT12, NT11, and NT12 form a latch circuit. The output signal OP and the output signal ON are opposite in phase.

Sources of PT11 and PT12 are connected to a node PS. Sources of NT11 and NT12 are connected to GND. A PMOS transistor PT13 is connected between AVD and PS and /CLK is applied to a gate of PT13. An NMOS transistor NT13 is arranged in parallel with NT11 and an NMOS transistor NT14 is arranged in parallel with NT12. A gate of NT13 is connected to DP and a gate of NT14 is connected to DN.

The comparator of FIG. 5 includes a first main corrector 31 arranged in parallel with PT11, and a second main corrector 32 arranged in parallel with PT12. Here, the first main corrector 31 and the second main corrector 32 are collectively referred to as a first adjuster. Although the first main corrector 31 includes a plurality of lines in each of which the NMOS transistor NT31 and a switch SW31 are connected in series, only a single line is illustrated in FIG. 5. The switch SW31 of each line is controlled by a control signal SWN[n] from the first control circuit 20. That is, the first control circuit 20 may adjust, by the control signal SWN[n], the number of NMOS transistors NT31 connected in parallel to PT11.

Similarly, the second main corrector 32 includes a plurality of lines in each of which the NMOS transistor NT32 and a switch SW32 are connected in series. The first control circuit 20 may adjust, by the control signal SWP[n], the number of NMOS transistors NT32 connected in parallel to PT12.

Figure 6:
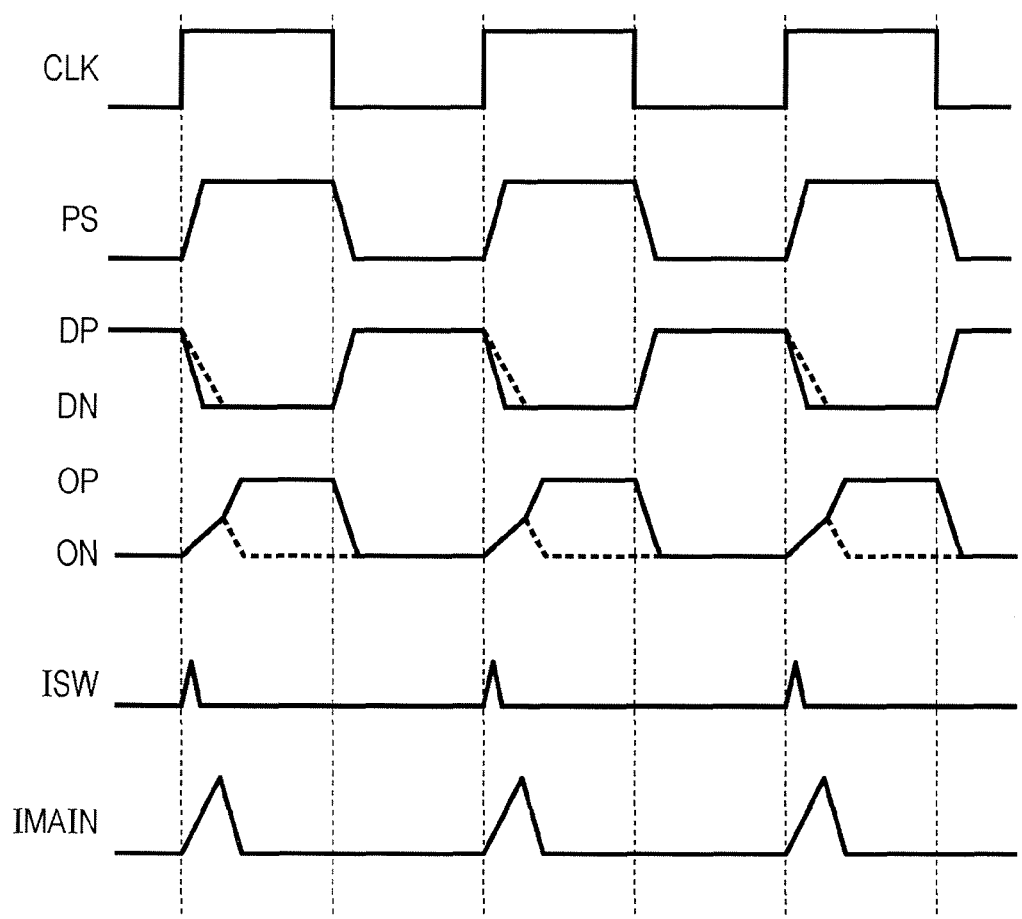
FIG. 6 is a timing diagram illustrating an operation of the comparator of FIG. 5.

FIG. 6 is a timing diagram illustrating an operation of the comparator of FIG. 5.

When CLK=L, the comparator is in a reset period: DP and DN are fixed to H and PS, OP, and ON are fixed to L.

Once it is turned to be CLK=H, the pre-stage of the comparator starts comparison of VIP and VIN. Then PT14 and PT15 are turned off, NT17 is turned on, and a current in accordance with VIP and VIN begins to flow into NT15 and NT16. Since PT14 and PT15 are turned off, the currents in DP and DN are drawn depending on VIP and VIN, and DP and DN decline toward L. At this time, a difference is made in the currents flowing in NT15 and NT16 depending on VIP and VIN, and DP and DN differ in the rate of decline. In particular, if VIP>VIN, the rate of decline of DP is high, and if VIP<VIN, the rate of decline of DN is high. In FIG. 6, the side in which the rate of decline is high is illustrated by a solid line and the side in which the rate of decline is low is illustrated by a dashed line.

At the same time, in the second stage, it is turned to be /CLK=L, PT13 is turned on, a current begins to flow and charging of OP and ON is started. However, NT13 and NT14 are turned on since voltages of DP and DN are applied to the gates thereof, and currents are drawn from the nodes of OP and ON (discharged). NT31 of the first main corrector 31 and NT32 of the second main corrector 32 are turned on since voltages of DP and DN are applied to the gates thereof, and NT31 and NT32 of the line of which SW31 is turned on passes a current through the nodes of OP and ON (charges). Therefore, a difference is made in the charge of OP and ON depending on the rate of decline in DP and DN. In particular, supposing that driving ability of PT13 is sufficiently high, voltage drop of OP is determined by driving ability obtained by subtracting driving ability of NT13 from the sum of the total driving ability of NT31 to which the first main corrector 31 is connected (that is, SW31 is ON) and driving ability of PT11. Similarly, voltage drop of ON is determined by driving ability obtained by subtracting driving ability of NT14 from the sum of the total driving ability of NT32 to which the second main corrector 32 is connected (that is, SW32 is ON) and driving ability of PT12. Therefore, by adjusting the number of SW31 of the first main corrector 31 to be turned on and the number of SW32 of the second main corrector 32 to be turned on, the driving force with which DP and DN drive a differential latch circuit is made to be changed. Thus, a degree of voltage drop of OP and ON may be adjusted. That is, sensitivity of change of state of the differential latch circuit by DP and DN is adjustable by the first main corrector 31 and the second main corrector 32.

Here, in a case in which all SW31 of the first main corrector 31 and SW32 of the second main corrector 32 are off and there is no offset in the comparator, the output is inversed since VIP-VIN=0. Here, changing a threshold into VIP-VIN=predetermined value>0 will be considered.

When an input signal which is VIP>VIN is input, DP declines to L before DN does, an amount of a current flowing out of OP decreases, and a greater amount of electric charge collects in the node of OP than in the node of ON. The difference in electric charge is adjusted by compensating for by passing a current into the node of ON via NT32 and applying electric charge at the time of determination (CLK=H) by turning on SW32 of the second main corrector 32 controlled by SWP[n]. Since the number of SW32 to be turned on is increased, the number of VIP-VIN=predetermined value is increased accordingly: therefore, the number of SW32 to be turned on is set at a desired predetermined value.

If, on the other hand, VIP<VIN, SW31 of the first main corrector 31 is turned on, the number of SW31 to be turned on is adjusted and VIN-VIP is set at a predetermined value. Since VIP-VIN corresponds to offset, setting VIP-VIN=predetermined value=0 is equivalent to setting offset at zero. If it is set at predetermined value≠0, a threshold will be set at a desired predetermined value. Hereinafter, a case in which a threshold is set at a desired predetermined value will be described: the same process may be applied to setting offset at zero.

Note that the first main corrector 31 and the second main corrector 32 passes a current only at the time of determination and do not pass a current when it is not used. In particular, the current is passed when voltage at the node DP or DN exceeds a threshold value Vth of the transistor and voltage of the node PS is not 0. ISW in FIG. 6 represents timing at which NT31 and NT32 of the first main corrector 31 and the second main corrector 32 are turned on. Further, in FIG. 6, IMAIN represents a current which flows into the nodes of the outputs OP and ON. Therefore, the currents flow in the first main corrector 31, the second main corrector 32 and the comparator in an even short period of CLK=H and thus power consumption is small.

For example, if there is a threshold variation of, for example, 5 mV when a single NT31 or NT32 is connected, two NT31 or NT32 may be turned on so that, for example, VIP-VIN=10 mV. If a threshold variation for each NT31 or NT32 is known in advance, the first control circuit 20 starts a real circuit operation after setting on and off of SW31 or SW32 in accordance with data representing the threshold provided from outside.

If a threshold variation for each NT31 or NT32 is not known, the first control circuit 20 performs, for example, calibration before starting real circuit operation to detect a threshold corrected value and store the detected threshold corrected value in the circuit.

Figure 7:
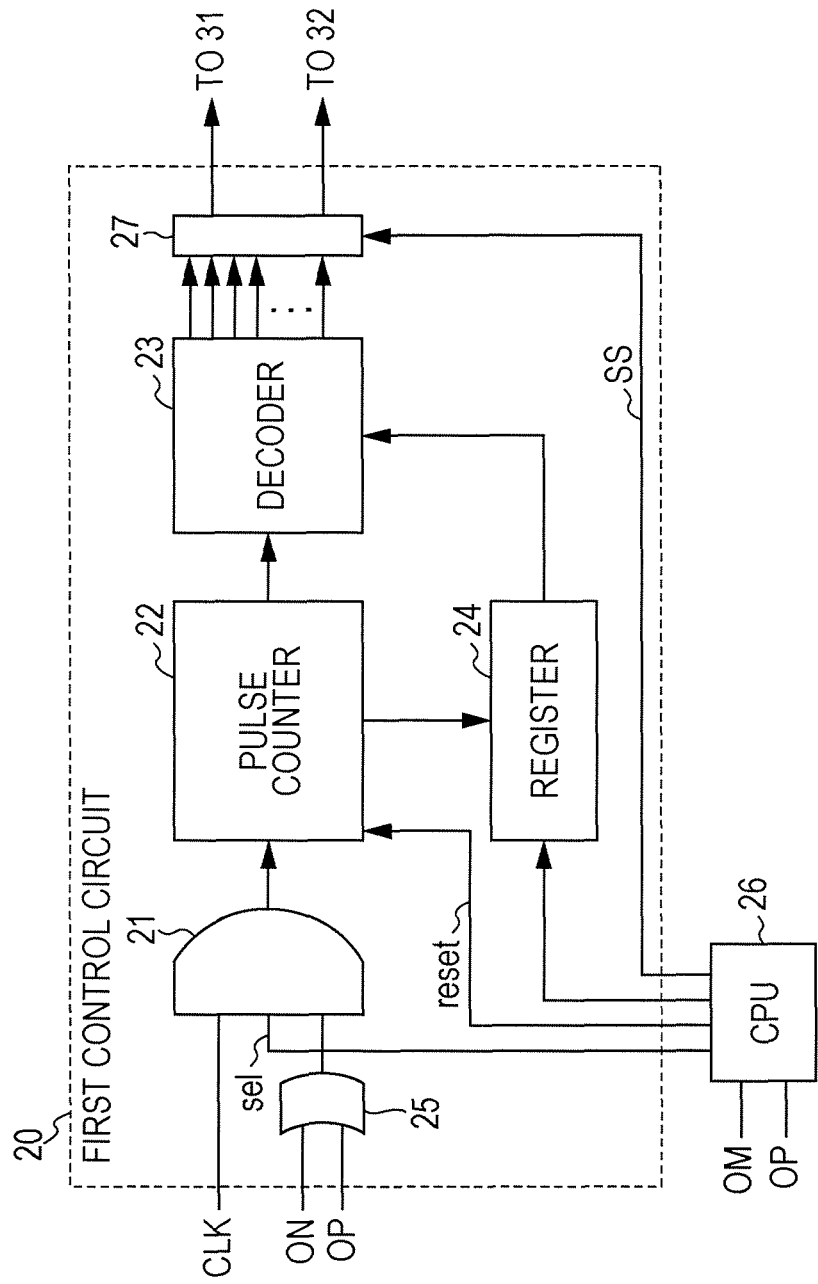
FIG. 7 is a diagram illustrating a circuit configuration of a control circuit in a case in which calibration of the comparator of FIG. 5 is performed.

FIG. 7 is a diagram illustrating a circuit configuration of the first control circuit 20 in a case in which calibration is performed. The first control circuit 20 includes an AND gate 21, a pulse counter 22, a decoder 23, a register 24, an OR gate 25, and a signal supply circuit 27. A CPU 26 is a circuit included in an LSI in which the comparator of the first embodiment or an A/D converter including the comparator is provided and which outputs a control signal to the first control circuit 20. If the CPU 26 is not included, it is possible to generate a control signal with, for example, a simple sequential circuit.

In response to the output signal OP or ON of the comparator, the OR gate 25 outputs H when either of them is H. In a case in which both a correction signal sel output from the CPU 26 when the first control circuit 20 performs a calibration operation and output of the comparator are H, the AND gate 21 supplies CLK to the pulse counter 22.

The pulse counter 22 counts CLK while CLK is supplied from the AND gate 21 and, when the supply of CLK from the AND gate 21 is stopped, outputs the count value at that time to the register 24 as a corrected value cal.

The decoder 23 is a circuit which outputs a code signal in accordance with the corrected value cal when the corrected value cal is received from the register 24. The register 24 is a memory circuit which stores a corrected value cal output from the pulse counter 22.

In a case in which the comparator performs a normal operation, the first control circuit 20 causes the data stored in the register 24 to be output to the decoder 23 in response to a writing instruction from the CPU 26. The decoder 23 decodes data from the register 24 and outputs the code signals to the first main corrector 31 and the second main corrector 32. In a case in which the comparator performs a calibration operation, the first control circuit 20 performs an operation described in FIG. 10.

Figure 8:
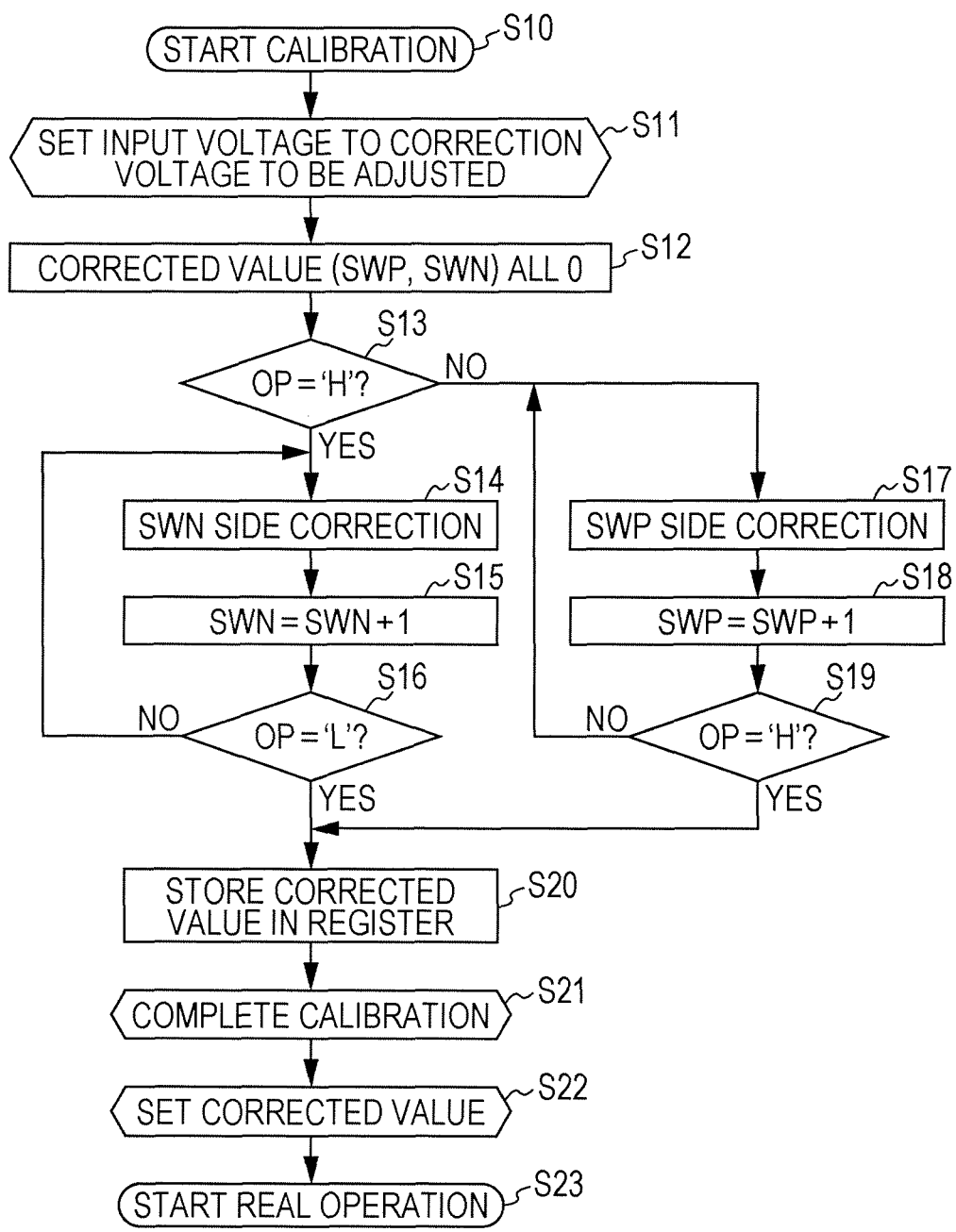
FIG. 8 is a flowchart illustrating a calibration operation of the comparator.

FIG. 8 is a flowchart illustrating a calibration operation of the comparator. Calibration is started at step S10. VIN is set at a predetermined value which is, for example, 1.0 V.

In step S11, voltage of the input signal VIP to be input in the comparator is set at a correction voltage to be adjusted. For example, in a case in which the comparator is set so that OP is changed to H(1) when VIP is less than 1.10 V and so that OP is changed to L(0) when OP is 1.10 V or greater, in other words, in a case in which the threshold is set at VIN+0.10 V, VIP is set at 1.10 V.

In step S12, all SWN[n] and SWP[n] output from the first control circuit 20 are set at 0(L).

In step S13, it is determined whether OP=H or not: if OP=H, the process proceeds to step S14 and, if OP=L, the process proceeds to step S17.

In step S14, SWN side correction to correct the number of switches SW31 of the first main corrector 31 to be connected (turned on) is performed.

In step S15, the number of switches SW31 of the first main corrector 31 to be turned on is increased by one (SWN=SWN+1).

In step S16, it is determined whether OP has changed to L: if OP has not changed to L, the process returns to step S14 and, if OP has changed to L, the process proceeds to step S20.

By repeating the process from steps S14 to S16, the comparator is set so that, if VIP is 1.10 V or less, OP is changed to H and, if VIP is greater than 1.10 V, OP is changed to L. That is, the threshold is set at VIN+0.10 V=1.10 V.

In step S17, SWP side correction to correct the number of switches SW32 of the second main corrector 32 to be connected (turned on) is performed.

In step S18, the number of switches SW32 of the second main corrector 32 to be turned on is increased by one (SWP=SWP+1).

In step S19, it is determined whether OP has changed to H: if OP has not changed to H, the process returns to step S17 and, if OP has changed to H, the process proceeds to step S20.

By repeating the process from steps S17 to S19, the comparator is set so that, if VIP is less than 1.10 V, OP is changed to H and, if VIP is 1.10 V or greater, OP is changed to L. That is, the threshold is set at VIN+0.10 V=1.10 V.

In step S20, the corrected values SWN and SWP are stored in the register (memory). If all the switches SW31 of the first main corrector 31 are off (open), SWN=0 and, if all the switches SW32 of the second main corrector 32 are off (open), SWP=0.

In step S21, calibration is completed. In step S22, the corrected values stored in step S20 are set in the first main corrector 31 and in the second main corrector 32. In step S23, a real operation which performs normal comparison is started.

In the threshold correction described above, when VIN is set at 1.0 V, a range of threshold correctable by the first main corrector 31 is 0.20 V and a range of threshold correctable by the second main corrector 32 is 0.20 V, the threshold may be set within a range of from 0.80 V to 1.20 V.

Figure 9:
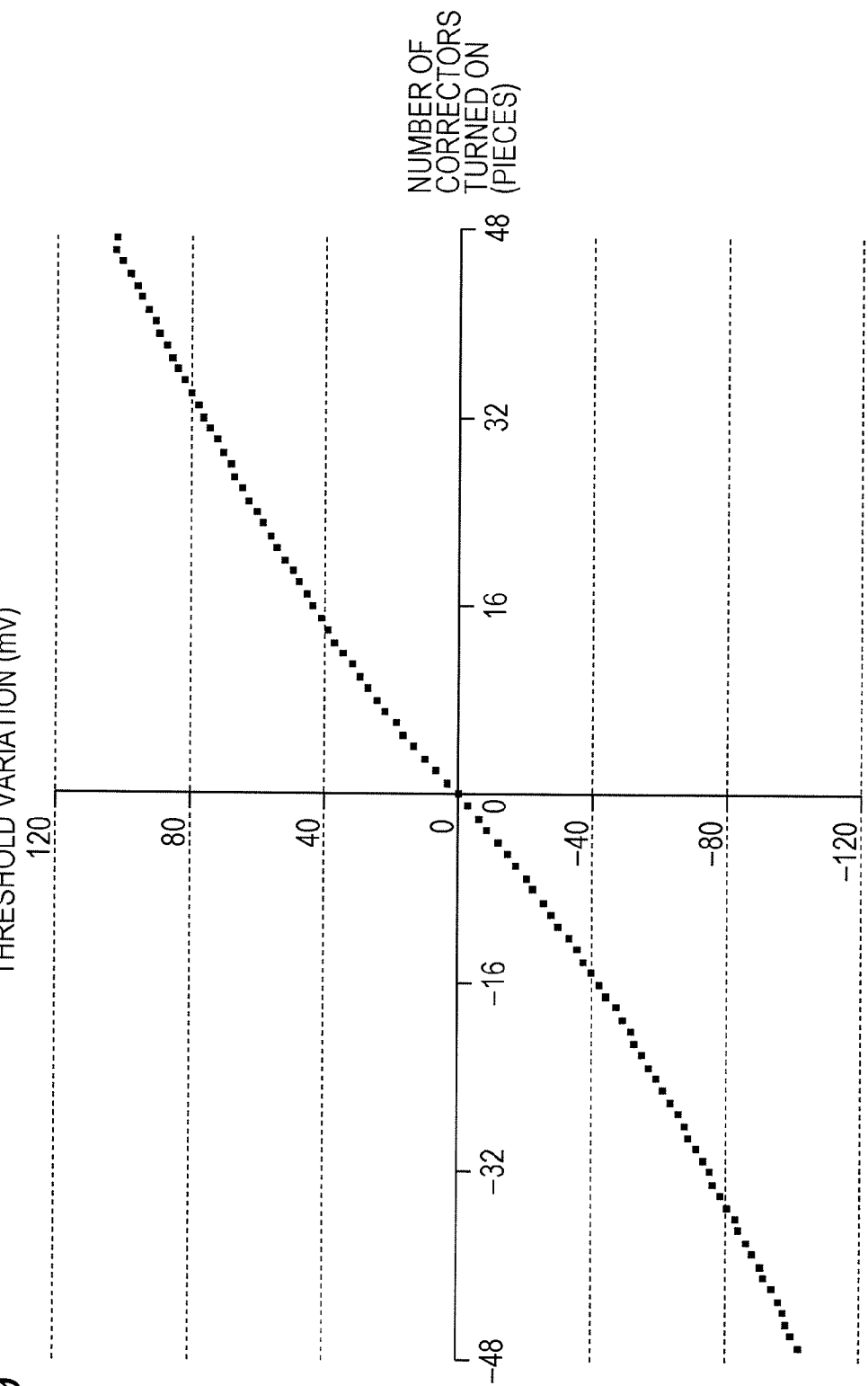
FIG. 9 is a diagram illustrating an example of an offset correction amount by a calibration operation.

FIG. 9 is a diagram illustrating an example of an offset correction amount by a calibration operation described above. 48 switches SW31 and SW32 of the same size are provided in each of the first main corrector 31 and the second main corrector 32. The horizontal axis of FIG. 9 represents the number of transistors to be turned on in the corrector, + represents turning on the switch SW32 on the side of the second main corrector 32, that is, SWP, and − represents turning on the switch SW31 on the side of the first main corrector 31, that is, SWN. The vertical axis of FIG. 9 represents a variation of the threshold, which represents a value of VIP-VIN when offset correction is completed. For example, if fifteen switches SW32 are turned on in the second main corrector 32, the threshold becomes 40 mV and this means that output is inverted when VIP-VIN reaches this value. Thus, in the comparator of FIG. 5, the threshold may be desirably varied in a certain range.

Note that the value of threshold variation may be varied to some extent by changing the size of NT31 and NT32 of the correctors 31 and 32. All the transistors NT31 and NT32 are not necessarily the same in size but the size thereof may be desirably determined.

As described above, in the comparator of FIG. 5, offset correction is possible without using any external bias circuit or the like and, therefore, it is possible to change comparative threshold in a certain range.

Since the comparator of FIG. 5 corrects threshold without adding a capacitor to a signal path, decline in speed is not caused by a visible load as in the correcting method in which a capacitor is added, whereby no decline in speed in the comparator is caused.

Further, in the correction in the comparator of FIG. 5, since no stationary current is passed but a current is passed only at the time of determination, an increase in power consumption may be suppressed.

As described above, in the comparator of FIG. 5, offset correction is possible without using any external bias circuit or the like and, therefore, it is possible to change comparative threshold in a certain range. However, a threshold variation is affected by corner conditions, temperature, power supply voltage and the like of a transistor fabricating process. Recently, operating voltage is lowered to a value near the operating limit in order to reduce power consumption. However, with such low operating voltage, a threshold variation becomes relatively large and, therefore, the threshold variation does not necessarily take a desired value.

Figure 10:
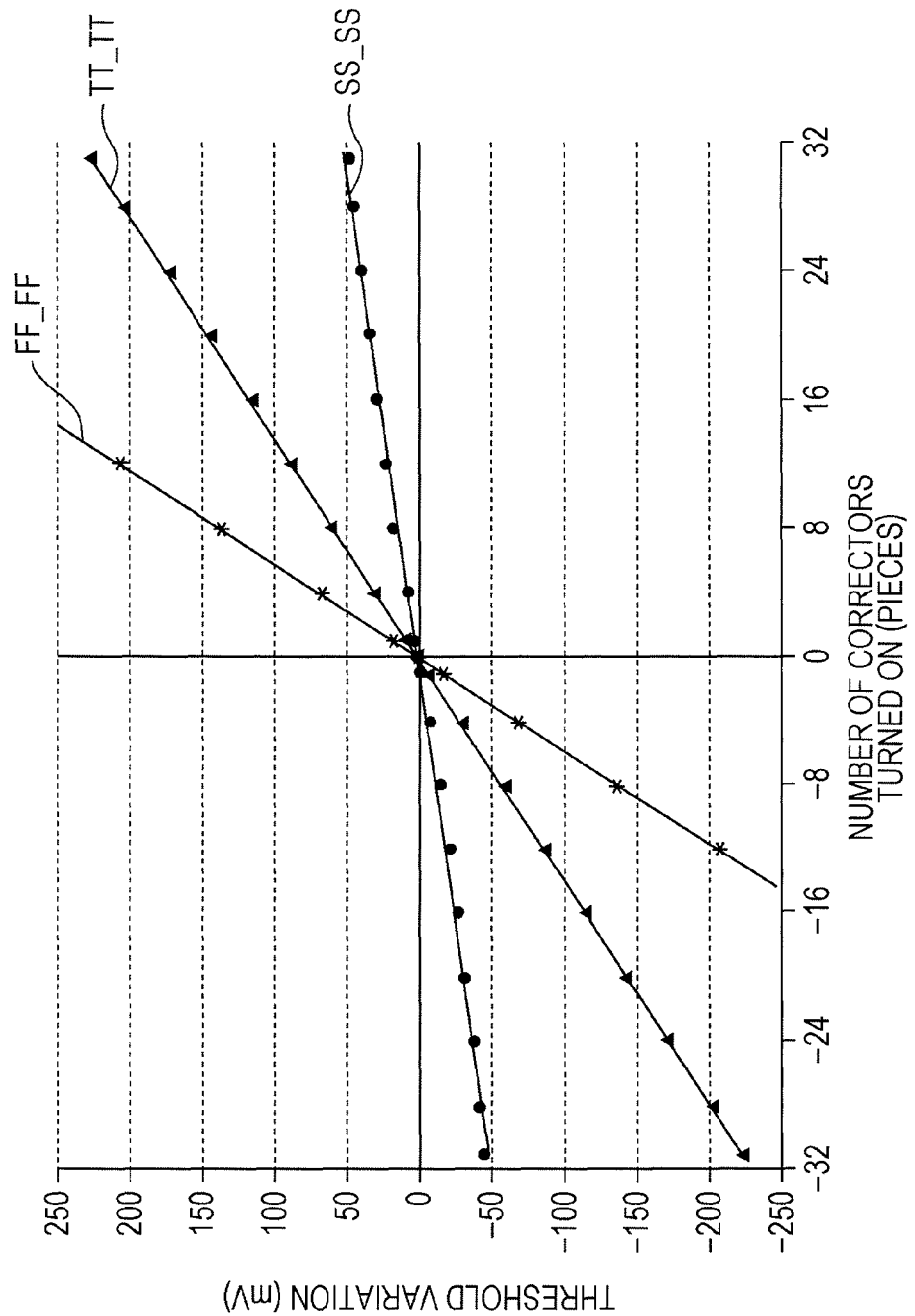
FIG. 10 is a diagram illustrating a change in a threshold variation in a case in which a comparator is fabricated under corner conditions of high speed-high speed (FF_FF), standard speed-standard speed (TT_TT), and low speed-low-speed (SS_SS) and in a case in which the number of transistors to be turned on is changed.

FIG. 10 is a diagram illustrating a change in a threshold variation in a case in which a comparator is fabricated under corner conditions of high speed-high speed (FF_FF), standard speed-standard speed (TT_TT), and low speed-low-speed (SS_SS) and in a case in which the number of transistors to be turned on is changed. In the case of high speed-high speed (FF_FF), only by turning on the half or less than the transistors of the first main corrector 31 and the second main corrector 32, a threshold variation is varied as much as ±250 mV. In the case of low speed-low-speed (SS_SS), even if all the transistors of the first main corrector 31 and the second main corrector 32 are turned on, a threshold variation is ±50 mV or less. For example, in a case in which a fabricating process of low speed-low-speed (SS_SS) is used, if there is offset of ±50 mV or greater, it is not possible to adjust the offset to 0 V and it is not possible to set the threshold at a value varying ±50 mV or greater. Further, in a case in which a fabricating process of high speed-high speed (FF_FF) is used, since a threshold variation by turning on and turning off a single transistor is about 15 mV, it is not possible to adjust offset with resolution of 15 mV or less.

That is, the matter of a range of change in threshold variation in the case in which the number of transistors to be turned on is changed is a matter of range of change and sensitivity of threshold variation with respect to the number of transistors to be turned on. The comparator of FIG. 5 is desirably adjustable its range of change and sensitivity of threshold variation depending on, for example, corner conditions of the fabricating process and usage conditions.

Figure 11:
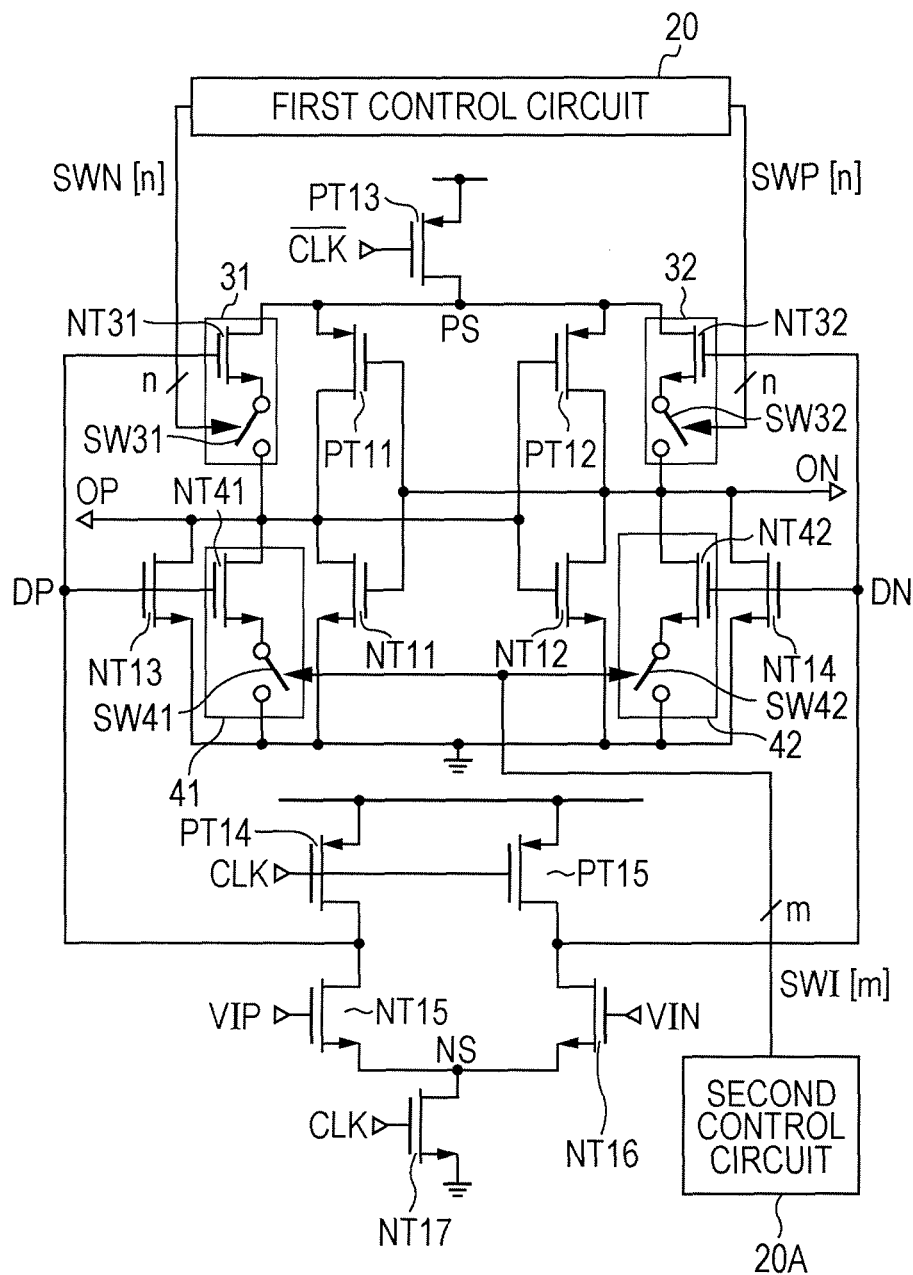
FIG. 11 is a circuit diagram of a comparator of a first embodiment.

FIG. 11 is a circuit diagram of a comparator of a first embodiment. The comparator of the first embodiment is the comparator of FIG. 5, of which range of change and sensitivity of threshold variation are adjustable.

The comparator of the first embodiment includes a configuration similar to that of the comparator of FIG. 5 except for including a first sub-correction circuit 41 arranged in parallel with NT11 and NT13, a second sub-correction circuit 42 arranged in parallel with NT12 and NT14, and a second control circuit 20A.

Here, the first sub-correction circuit 41 and the second sub-correction circuit 42 are collectively referred to as a second adjuster. Although the first sub-correction circuit 41 includes a plurality of lines in each of which the NMOS transistor NT41 and a switch SW41 are connected in series, only a single line is illustrated in FIG. 11. The switch SW41 of each line is controlled by a control signal SWI[m] (a first slope code) from the second control circuit 20A. That is, the second control circuit 20A may adjust, by the control signal SWI[m], the number of NMOS transistors NT41 connected in parallel to NT11 and NT13.

Similarly, the second sub-correction circuit 42 includes a plurality of lines in each of which the NMOS transistor NT42 and a switch SW42 are connected in series. The second control circuit 20A may adjust, by the control signal SWI[m], the number of NMOS transistors NT42 connected in parallel to NT12 and NT14. Here, the first and the second sub-correction circuits 41 and 42 each include a line of the NMOS transistor and the switch which are connected in series; however, the switch may be implemented by an NMOS transistor or a PMOS transistor alone, or by a CMOS structure. Further, a NAND gate or a NOR gate may be used instead of the NMOS transistor and the switch which are connected in series. This is applied also to those switches described hereinafter as well.

Here, for example, it is controlled, by the control signal SWI[m], so that the number of SW41 to be connected in the first sub-correction circuit 41 and the number of SW42 to be connected in the second sub-correction circuit 42 are opposite to each other. In particular, when SWI[m] is an integer of 0 to 31 and SWI[m]=k, it is controlled so that k SW41 are connected, the remaining m−k=31−k of SW41 are not connected, m−k=31−k of SW42 are connected and the remaining k SW42 are not connected.

In the comparator of the first embodiment, NT13 and the first sub-correction circuit 41 perform a function to draw electric charge which is charged in OP depending on the size of VIP from the moment CLK changed from "L" to "H" until DP declines to the ground. NT14 and the second sub-correction circuit 42 perform a function to draw electric charge which is charged in ON depending on the size of VIN from the moment CLK changed from "L" to "H" until DN declines to the ground. In the first embodiment, an effect of injecting electric charge into OP or ON by SWN[n] and SWP[n] is made variable by making the size of the function to draw electric charge from OP or ON variable. Therefore, a slope (see FIG. 10) of threshold variation with respect to the number of connected SW31 and SW32 in the first main corrector 31 and the second main corrector 32 is adjusted. Note that, at this time, since the same number of switches SW41 and SW42 in the first sub-correction circuit 41 and the second sub-correction circuit 42 are connected (turned on)/not connected (turned off), control by the second control circuit 20A does not adjust the offset of the comparator.

Since no stationary current flows through NT41 and NT42 in the first sub-correction circuit 41 and the second sub-correction circuit 42, an increase in electric power due to addition of the first sub-correction circuit 41 and the second sub-correction circuit 42 is small. Further, an increase in circuit area thereby is small because a resistance and a capacitor, which are passive elements, are not used.

As described above, since the comparator of the first embodiment adjusts, in addition to the threshold (offset), the sensitivity (slope) in threshold variation and the adjustable range when performing adjustment, it is possible to set the desired threshold even if a threshold variation is large.

Figure 12:
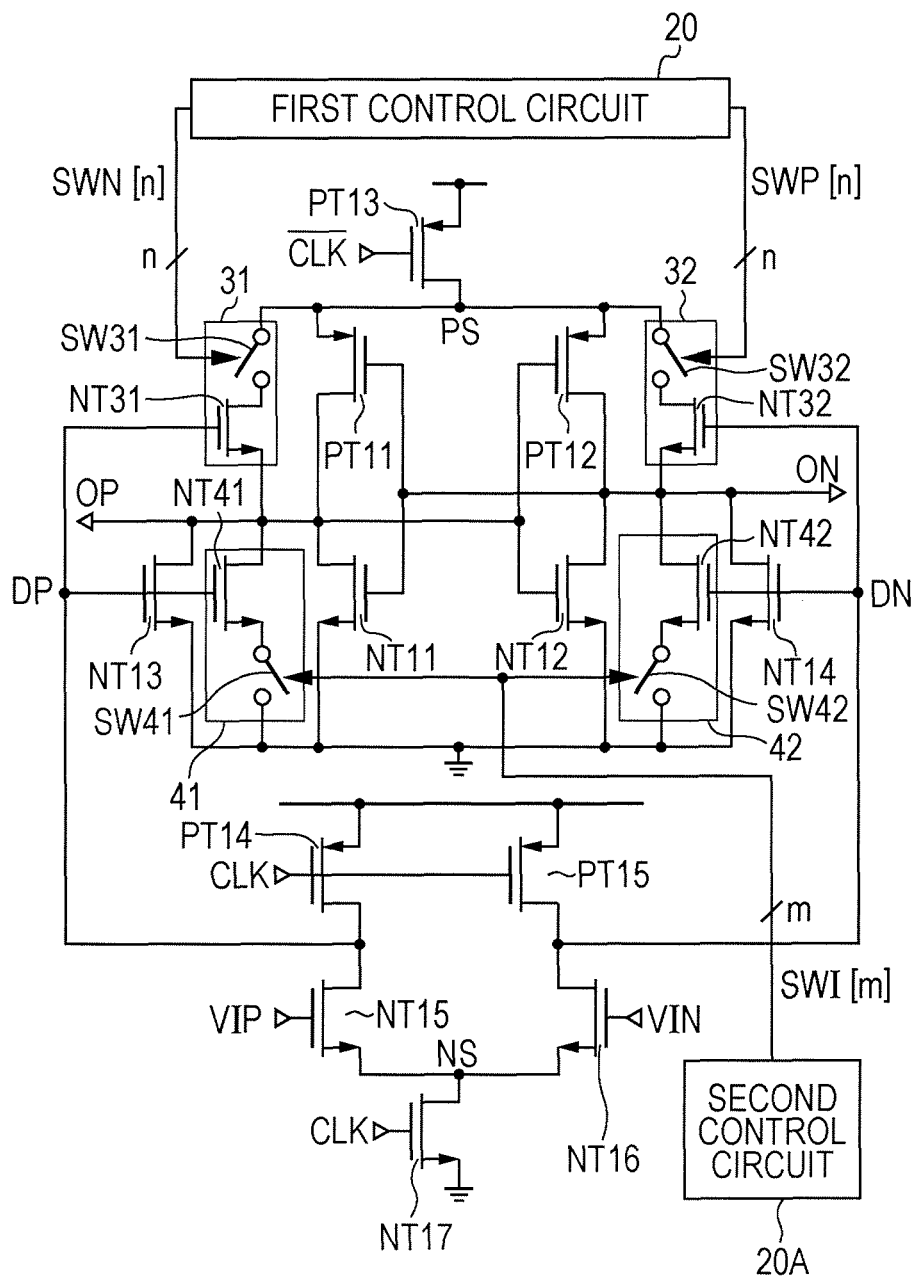
FIG. 12 is a circuit diagram of a modification of the comparator of the first embodiment.

The comparator of the first embodiment illustrated in FIG. 11 may have various modifications. Hereinafter, some modifications will be described. FIG. 12 is a circuit diagram of a first modification of the comparator of the first embodiment. This modification is the same as the comparator of the first embodiment of FIG. 11 except for the connecting order of an NMOS transistor NT31 and a switch SW31 in a first main corrector 31, and the connecting order of an NMOS transistor NT32 and a switch SW32 in a second main corrector 32. In this manner, even if the connecting order of the transistors and the switches in the first main corrector 31 and the second main corrector 32 is changed, the comparator operates in the same manner as the comparator of the first embodiment.

Figure 13:
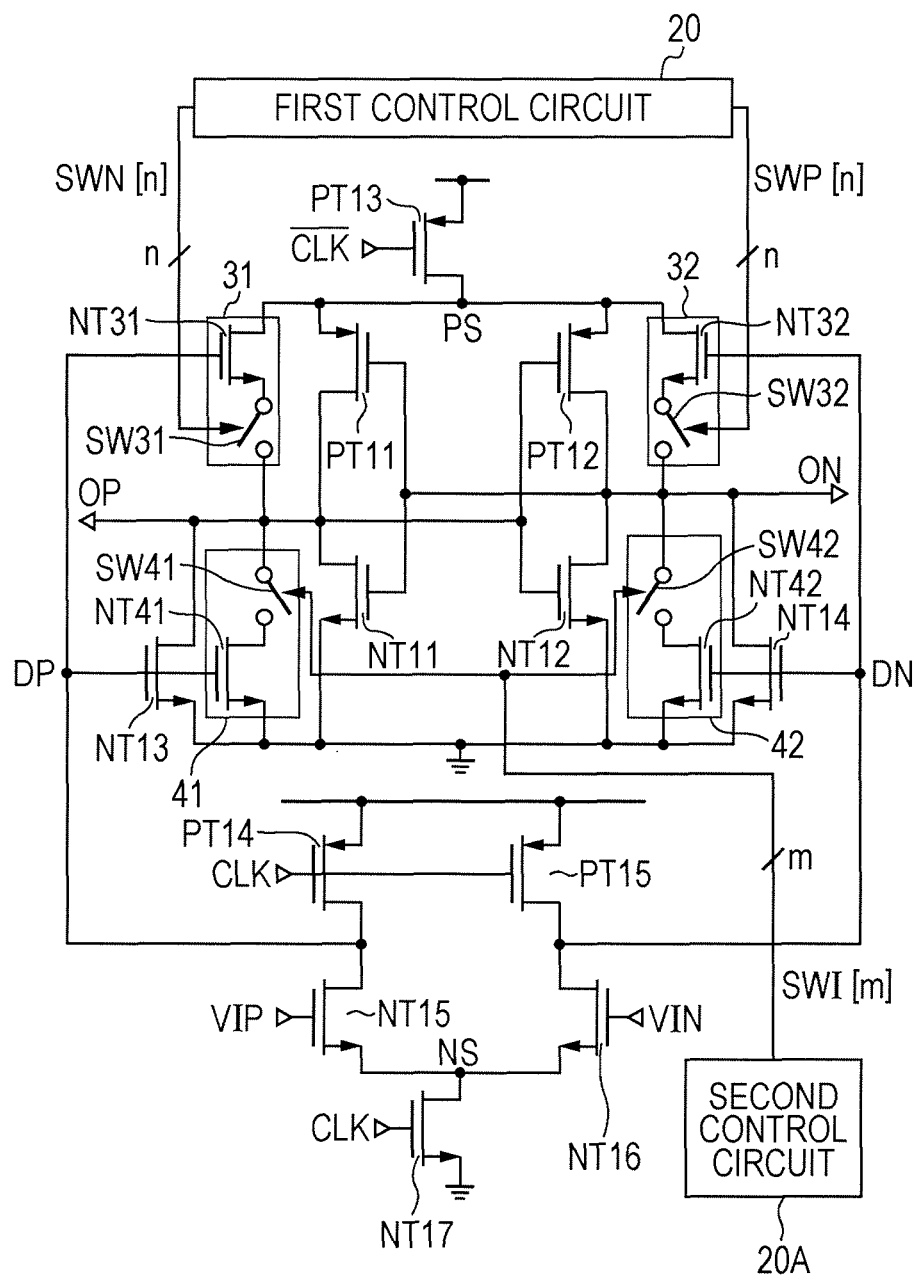
FIG. 13 is a circuit diagram of a modification of the comparator of the first embodiment.

FIG. 13 is a circuit diagram of a second modification of the comparator of the first embodiment. This modification is the same as the comparator of the first embodiment of FIG. 11 except for the connecting order of an NMOS transistor NT41 and a switch SW41 in a first sub-correction circuit 41, and the connecting order of an NMOS transistor NT42 and a switch SW42 in a second sub-correction circuit 42. In this manner, even if the connecting order of the transistors and the switches in the first sub-correction circuit 41 and the second sub-correction circuit 42 is changed, the comparator operates in the same manner as the comparator of the first embodiment.

Figure 14:
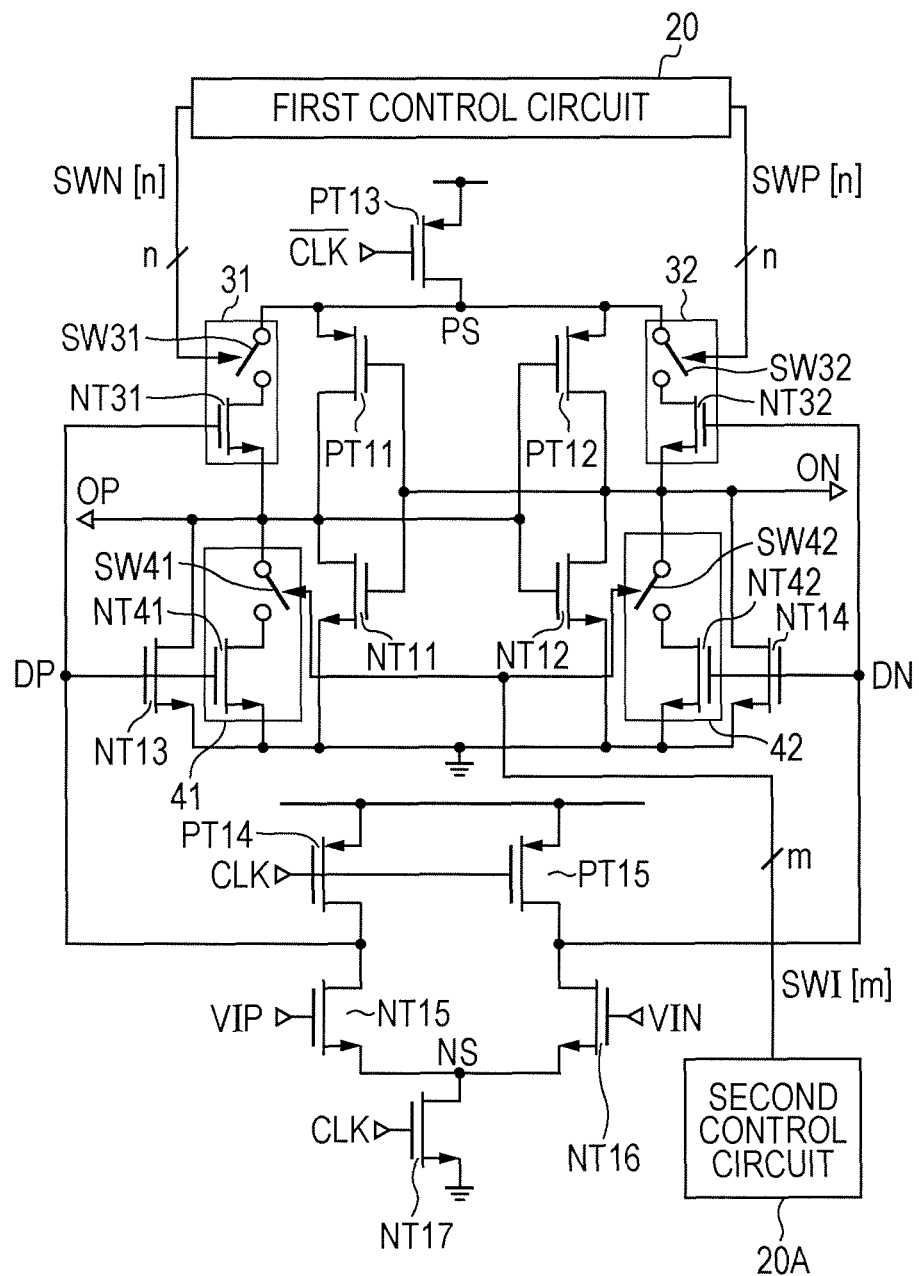
FIG. 14 is a circuit diagram of a modification of the comparator of the first embodiment.

FIG. 14 is a circuit diagram of a third modification of the comparator of the first embodiment. This modification is a product in which the first modification and the second modification are combined together and is the same as the comparator of the first embodiment except for the connecting order of transistors and switches in a first main corrector 31, a second main corrector 32, a first sub-correction circuit 41, and a second sub-correction circuit 42.

Figure 15:
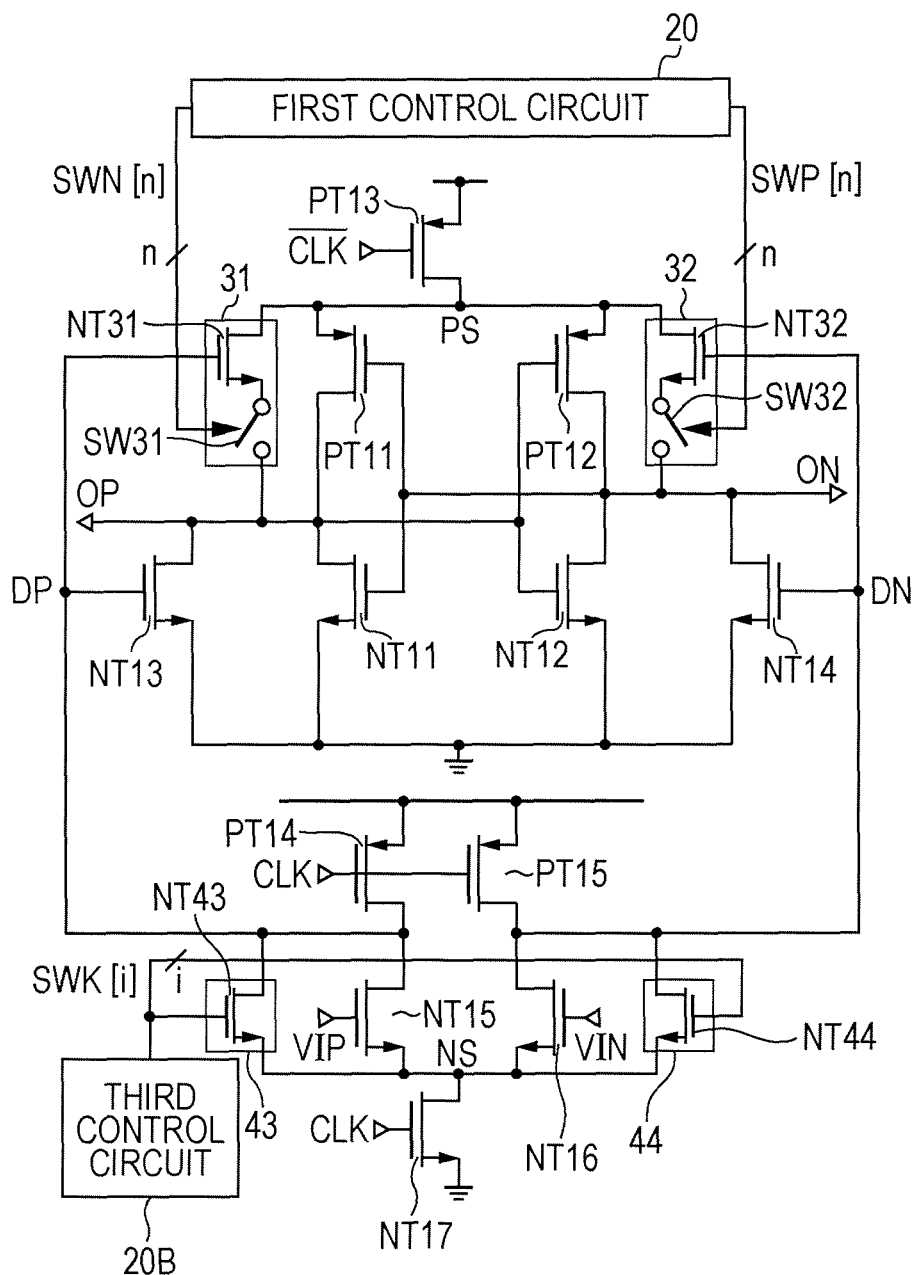
FIG. 15 is a circuit diagram of a comparator of a second embodiment.

FIG. 15 is a circuit diagram of a comparator of a second embodiment. In the comparator of the first embodiment, in the second stage, the first sub-correction circuit 41 is provided in parallel with NT11 and NT13, the second sub-correction circuit 42 is provided in parallel with NT12 and NT14, and the current amount to be drawn from OP and ON is adjusted in accordance with the input signal. In the comparator of the second embodiment, a current generated in a first stage is adjusted in accordance with an input signal.

Therefore, in the comparator of the second embodiment, the first sub-correction circuit 41, the second sub-correction circuit 42, and the second control circuit 20A are excluded from the comparator of the first embodiment, a third sub-correction circuit 43 and a fourth sub-correction circuit 44 are provided in a first stage, and a third control circuit 20B which controls the third sub-correction circuit 43 and the fourth sub-correction circuit 44 is further provided. The third sub-correction circuit 43 includes a plurality of NMOS transistors NT43 which are arranged in parallel with the NMOS transistors NT15 and to which gates input signals VIP are applied. The fourth sub-correction circuit 44 includes a plurality of NMOS transistors NT44 which are arranged in parallel with the NMOS transistors NT16 and to which gates input signal VIN are applied. For the convenience of illustration, a single NT43 and a single NT44 are illustrated in FIG. 15; actually, a plurality of NT43 and NT44 are provided as described above. SWK[i] (a second slope code) output from the third control circuit 20B is applied to gates of NT43 and NT44, and the number of NT43 and NT44 to be turned on by SWK[i] is adjusted. Note that the number of NT43 and NT44 to be turned on is the same number. Here, in the illustrated example, the third sub-correction circuit 43 and the fourth sub-correction circuit 44 include a plurality of NMOS transistors which are arranged in parallel; however, PMOS transistors or CMOS structures may be used.

In the comparator of the second embodiment, the third sub-correction circuit 43 performs a function to draw electric charge which is charged in DP depending on the size of VIP from the moment CLK changed from "L" to "H" until DP declines to the ground. The fourth sub-correction circuit 44 performs a function to draw electric charge which is charged in DN depending on the size of VIN from the moment CLK changed from "L" to "H" until DN declines to the ground. In the second embodiment, the size of the function to draw electric charge from DP or DN is made variable. Since DP and DN change gate voltage of NT13 and NT14 of the second stage, an effect of injecting electric charge into OP or ON by SWN[n] and SWP[n] is increased or decreased. Therefore, a slope of threshold variation with respect to the number of connected SW31 and SW32 in the first main corrector 31 and the second main corrector 32 is adjusted. Note that, at this time, since the same number of NT43 and NT44 in the third sub-correction circuit 43 and the fourth sub-correction circuit 44 are turned on/off, control by the third control circuit 20B does not adjust the offset of the comparator.

Figure 16:
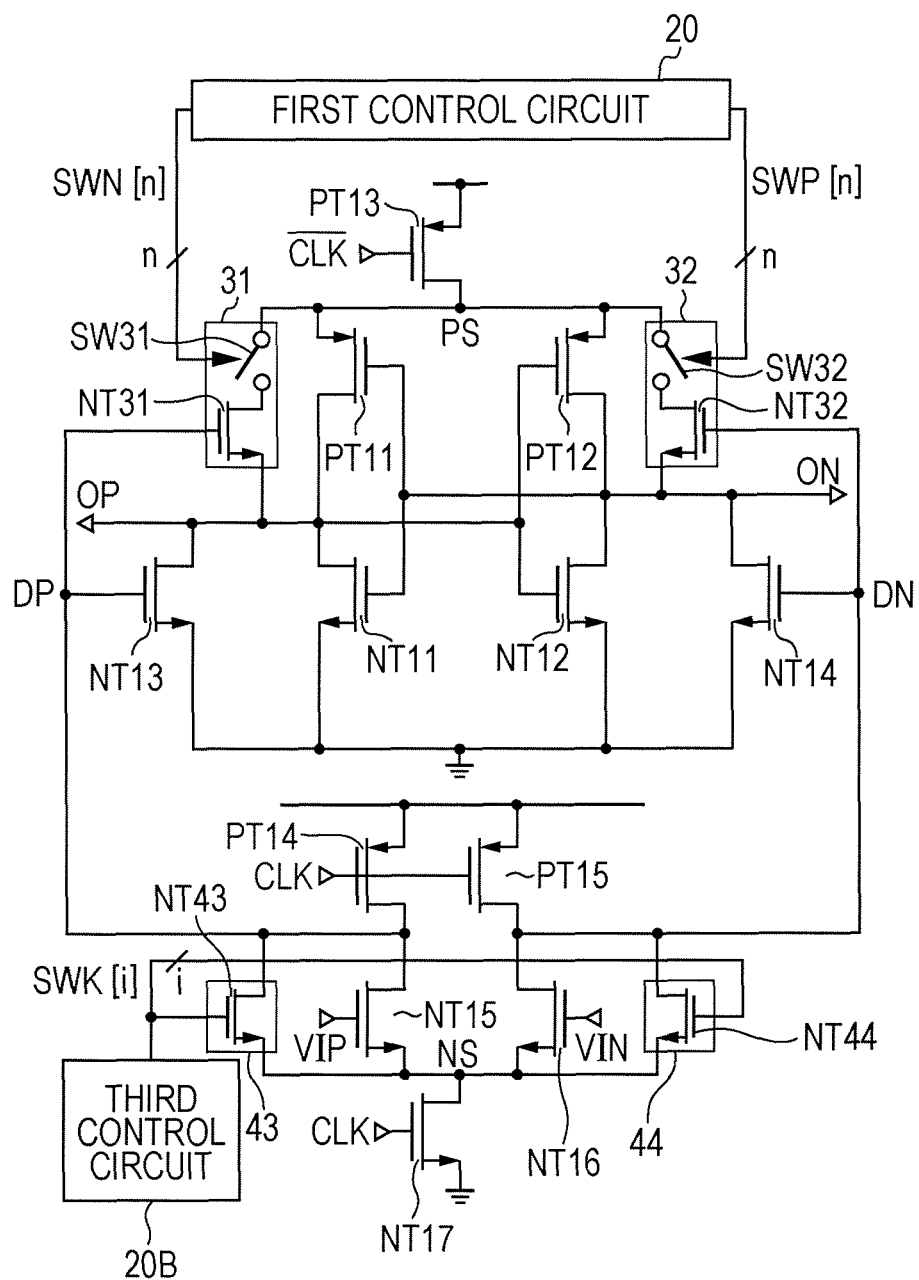
FIG. 16 is a circuit diagram of a modification of the comparator of the second embodiment.

Although the comparator of the second embodiment illustrated in FIG. 15 may have various modifications, only one modification will be described here. FIG. 16 is a circuit diagram of a first modification of the comparator of the second embodiment. This modification is the same as the comparator of the second embodiment of FIG. 15 except for the connecting order of an NMOS transistor NT31 and a switch SW31, and an NMOS transistor NT32 and a switch SW32 in a first main corrector 31 and a second main corrector 32.

Figure 17:
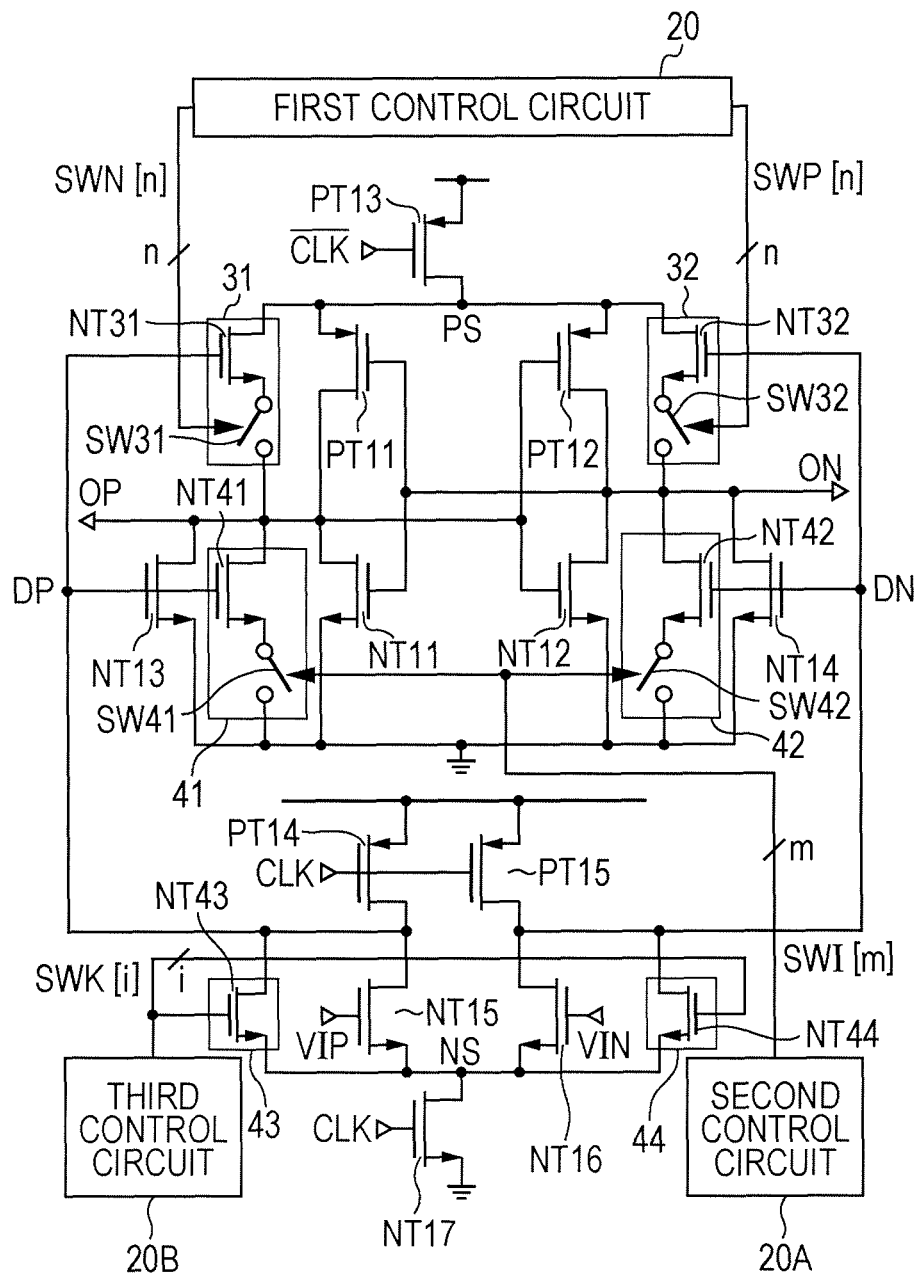
FIG. 17 is a circuit diagram of a comparator of a third embodiment.

FIG. 17 is a circuit diagram of a comparator of a third embodiment. The comparator of the third embodiment is a product in which the third sub-correction circuit 43, the fourth sub-correction circuit 44, and the third control circuit 20B of the second embodiment are added to the comparator of the first embodiment. A function to adjust the slope of threshold variation by the first sub-correction circuit 41, the second sub-correction circuit 42, and second control circuit 20A and a function to adjust the slope of threshold variation by the third sub-correction circuit 43, the fourth sub-correction circuit 44, and the third control circuit 20B may be composed, and thus exist together. In this case, the second control circuit 20A and the third control circuit 20B may be used as a common circuit and SWI[m] and SWK[i] may be used as a common signal. The size of each transistor of the first sub-correction circuit 41, the second sub-correction circuit 42, the third sub-correction circuit 43, and the fourth sub-correction circuit 44 may be the same or different.

Figure 18:
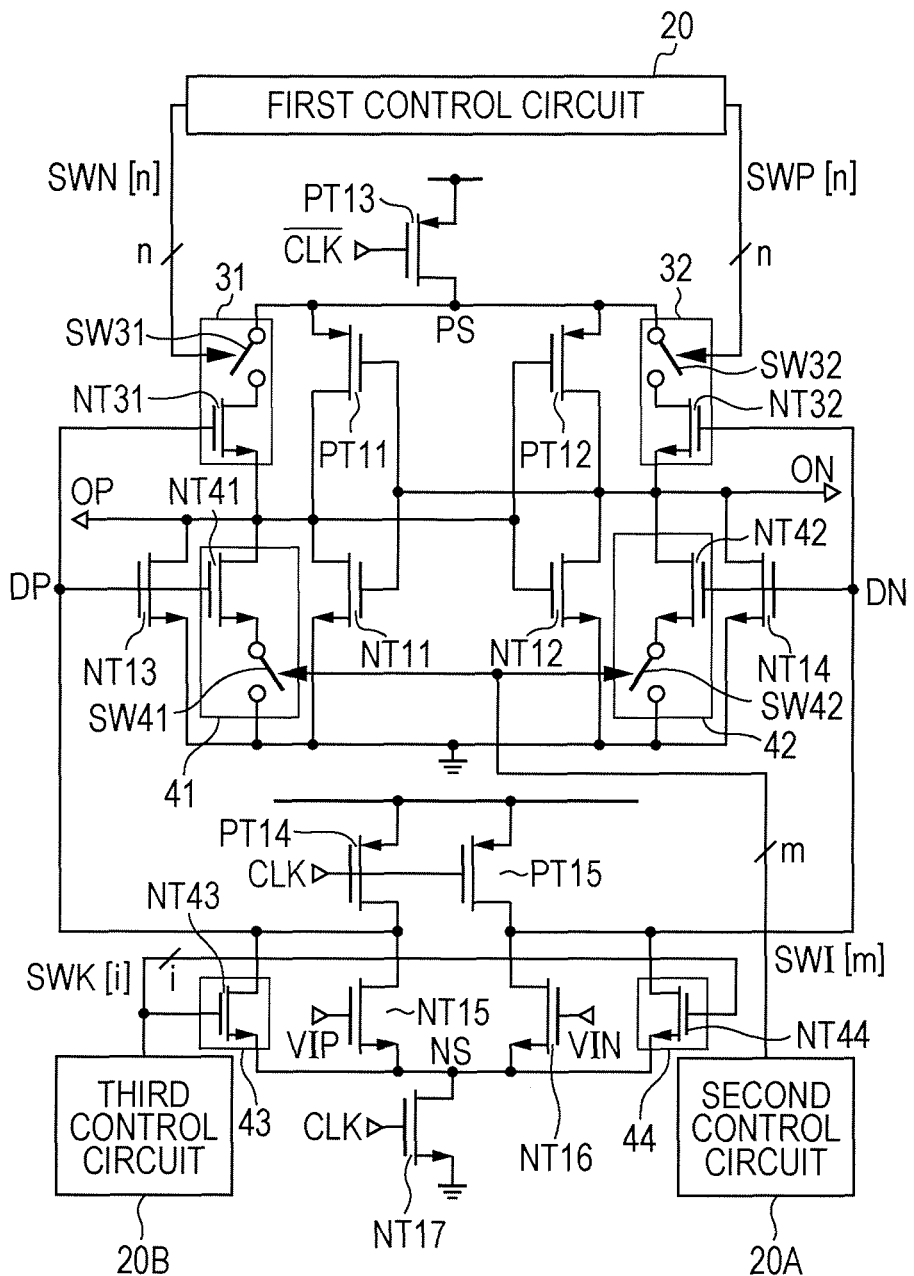
FIG. 18 is a circuit diagram of a modification of the comparator of the third embodiment.

The comparator of the third embodiment may also have various modification. Hereinafter, some modifications will be described. FIG. 18 is a circuit diagram of a first modification of the comparator of the third embodiment. This modification is the same as the comparator of the third embodiment of FIG. 17 except for the connecting order of an NMOS transistor NT31 and a switch SW31 in a first main corrector 31, and an NMOS transistor NT32 and a switch SW32 in a second main corrector 32.

Figure 19:
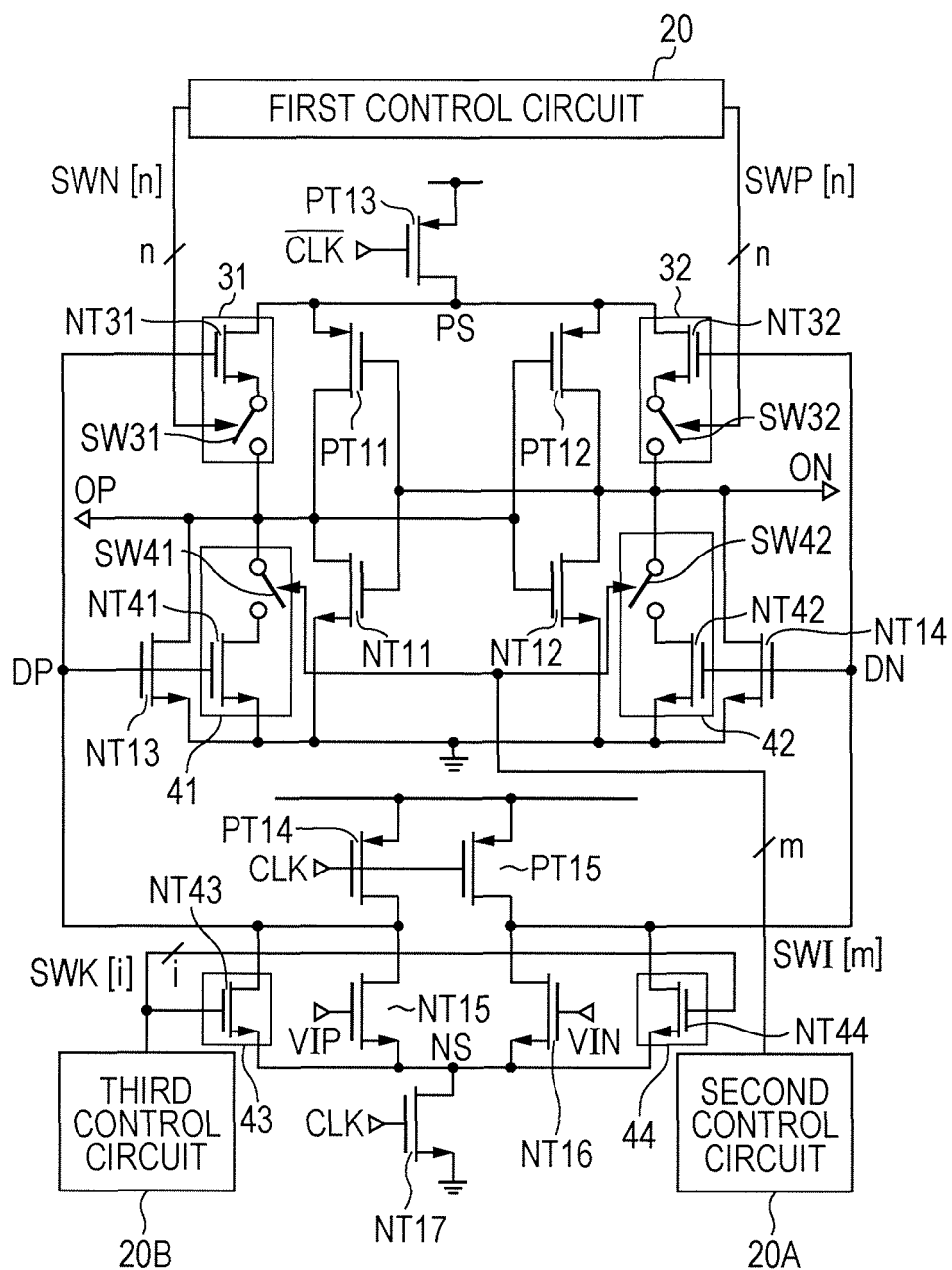
FIG. 19 is a circuit diagram of a modification of the comparator of the third embodiment.

FIG. 19 is a circuit diagram of a second modification of the comparator of the third embodiment. This modification is the same as the comparator of the third embodiment of FIG. 17 except for the connecting order of an NMOS transistor NT41 and a switch SW41 in the first sub-correction circuit 41, and an NMOS transistor NT42 and a switch SW42 in the second sub-correction circuit 42.

Figure 20:
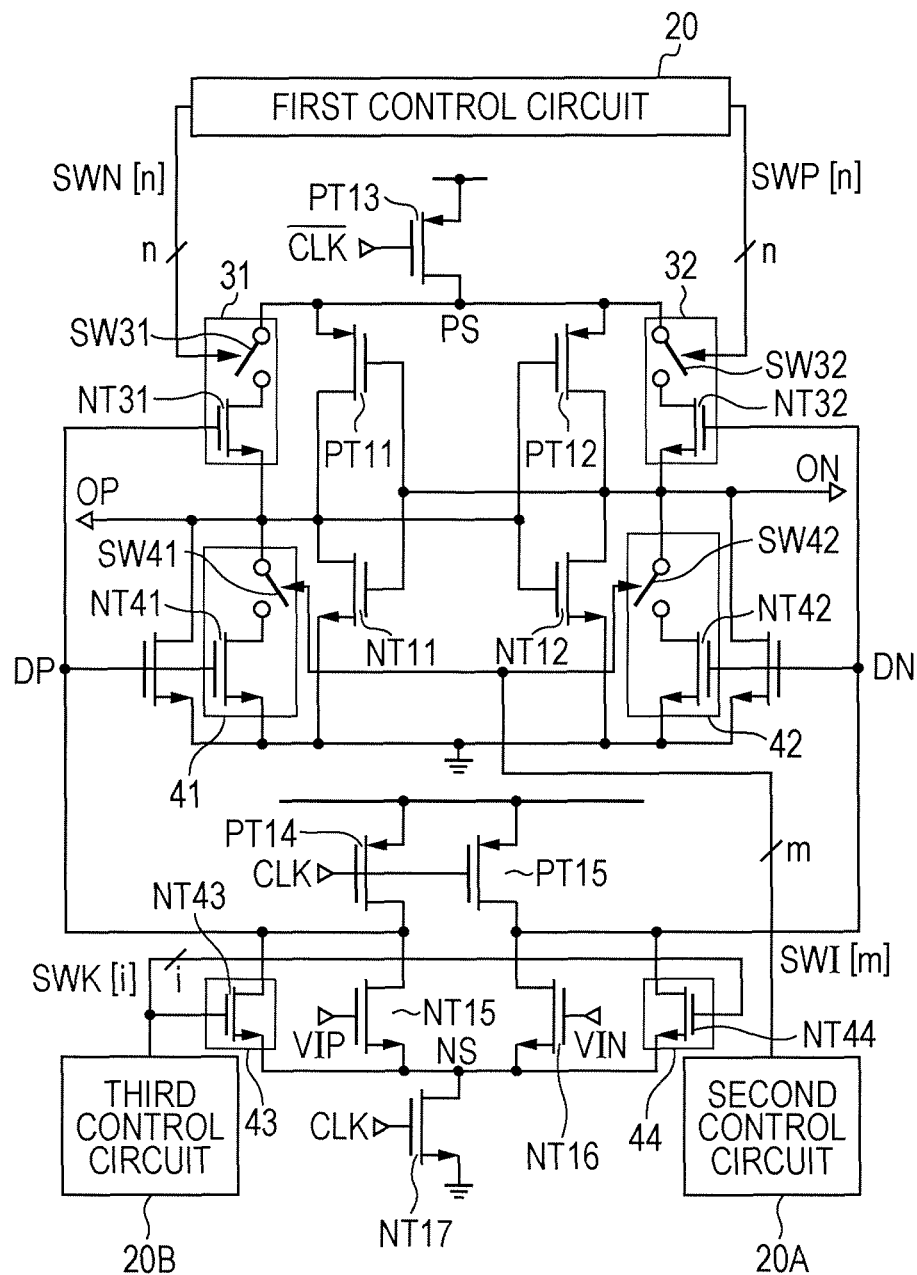
FIG. 20 is a circuit diagram of a modification of the comparator of the third embodiment.

FIG. 20 is a circuit diagram of a third modification of the comparator of the third embodiment. This modification is a product in which the first modification and the second modification of third embodiment are combined together and is the same as the comparator of the third embodiment except for the connecting order of transistors and switches in a first main corrector 31, a second main corrector 32, a first sub-correction circuit 41 and a second sub-correction circuit 42.

Figure 21:
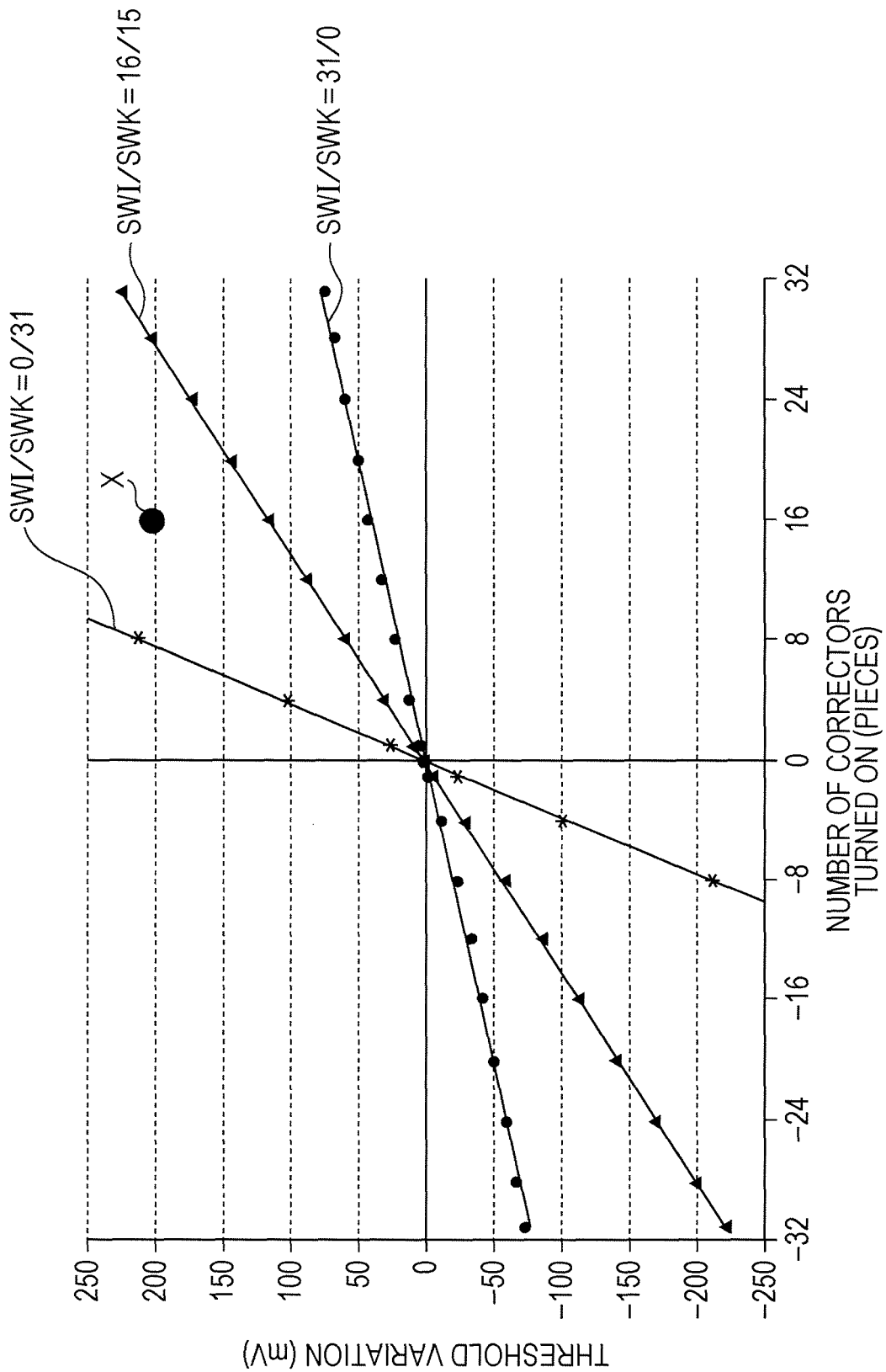
FIG. 21 is a diagram illustrating a change in a threshold variation in the comparator of the third embodiment fabricated under the corner conditions of standard speed-standard speed (TT_TT), in a case in which the number of transistors to be turned on in a first main corrector and a second main corrector is changed.

Next, the calibration operation will be described with reference to the comparator of the third embodiment. FIG. 21 is a diagram which corresponds to FIG. 9 and illustrates a change in a threshold variation in the comparator of the third embodiment fabricated under the corner conditions of standard speed-standard speed (TT_TT), in a case in which the number of transistors to be turned on in a first main corrector 31 and a second main corrector 32 is changed.

The comparator of the third embodiment includes thirty one lines of NT41 and SW41, thirty one lines of NT42 and SW42, thirty one NT43, and thirty one NT44. That is, m=31 and i=31. A second control circuit 20A and a third control circuit 20B output SWI[m] and SWK[i] such that m+i=31. Therefore, the number of thirty one SW41 in the first sub-correction circuit 41 and thirty one SW42 in the second sub-correction circuit 42 which are connected change in opposite directions, and the number of thirty one NT43 in the third sub-correction circuit 43 and thirty one NT44 in the fourth sub-correction circuit 44 which are turned on change in opposite directions. FIG. 21 illustrates a change of a threshold variation with a ratio of SWI[m] and SWK[i] (SWI/SWK) being 0/31, 16/15 and 31/0 as a parameter.

As illustrated in FIG. 21, it is considered that, by causing SWI/SWK to change, a threshold variation with respect to the change of the number of transistors to be turned on in the first main corrector 31 and the second main corrector 32 are changed greatly. That is, in FIG. 21, the slope of threshold variation is changed greatly.

Figure 22:
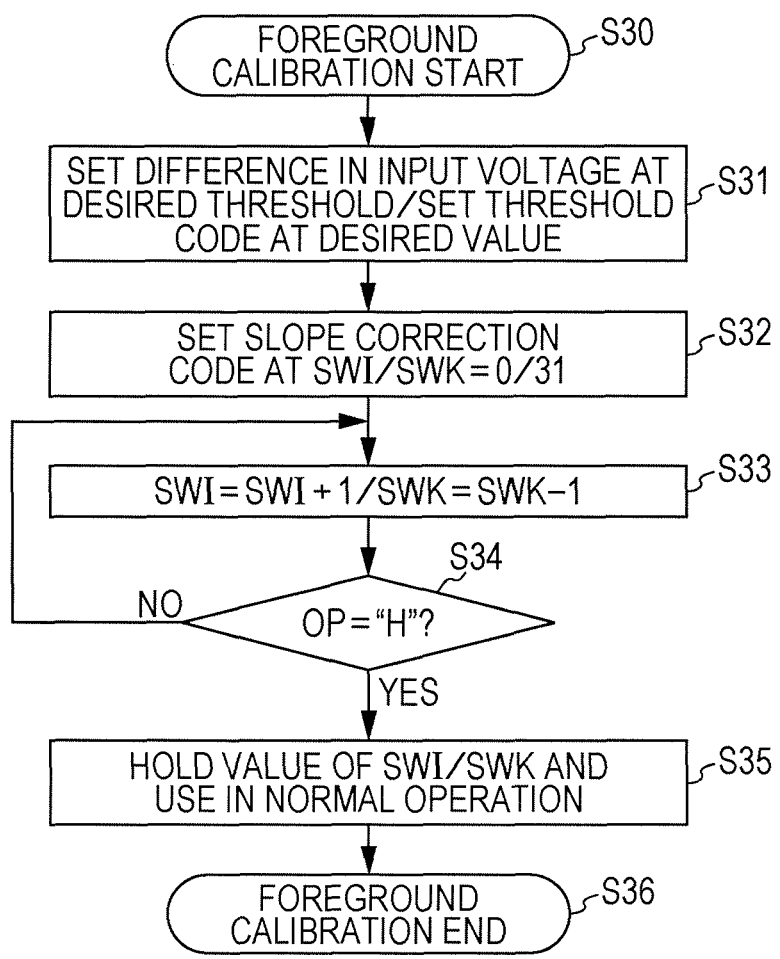
FIG. 22 is a flowchart illustrating a calibration operation of the comparator of the third embodiment.

FIG. 22 is a flowchart illustrating a calibration operation of the comparator of the third embodiment. This calibration operation is an operation in a case in which a threshold correction amount is set at a point represented by a reference numeral X in FIG. 21, that is, a threshold correction amount is set at 200 mV with the number of connected SW32 being 16.

In step S30, foreground calibration is started. In step S31, desired input voltage difference is set at desired threshold, and SWN[n] and SWP[n] (threshold codes) output by the first control circuit 20 are set at desired values. Here, as illustrated in FIG. 12, the threshold code SWN[n] is set at 0 and SWP[n] is set at 16, and input voltage is set at a desired correction amount=200 mV and are then input.

In step S32, SWI[m] (the first slope code) output from the second control circuit 20A is set at the initial value SWI [0] and SWK[i] (the second slope code) output from the third control circuit 20B is set at the initial value SWI [31], that is, SWI/SWK=0/31. In this state, all SW41 and SW42 are not connected and all SW43 and SW44 are connected.

In step S33, one is add to SWI[m], one is subtracted from SWK[i], and an output of the comparator is detected. In step S34, it is determined whether the comparator OP is "H" or not and, if OP="L," the process returns to step S33, and, if OP="H," the process proceeds to step S35. In this case, on the basis of a position of a point X of FIG. 21, the first determination result is OP="L" and thus the process returns to step S33. Then steps S33 and S34 are repeated until OP="H" is achieved.

In step S35, it is in a state in which OP is changed from OP="L" to OP="H", that is, a state in which the point X in FIG. 21 becomes the closest parameter SWI/SWK, and SWI [m] and SWK[i] at this time, that is, SWI/SWK, is held as the optimum values. The held SWI/SWK are used as optimum values when the comparator is made to perform a normal operation. In step S36, foreground calibration is completed.

Although the calibration operation of the comparator of the third embodiment has been described above, the calibration operation is not limited to the same. For example, in the example described above, SWI[m] and SWK[i] are changed in a correlated manner in which as one is increased, the other is decreased; however, SWI[m] and SWK[i] may be changed independently. Further, a degree of influence on OP and ON may be varied in the first and second sub-adjustment circuits 41 and 42 and the third and fourth sub-adjustment circuits 43 and 44, and one of which may be used for coarse adjustment and the other may be used for fine adjustment. The calibration operation of the comparators of the first and second embodiments may be similarly performed with the reduced number of variables.

Although a tail part of the circuit in the first stage is formed by the NMOS transistor and a tail part of the circuit in the second stage is formed by the PMOS transistor in the first to the third embodiments, the polarity of the transistors of the tail parts may be changed.

Figure 23:
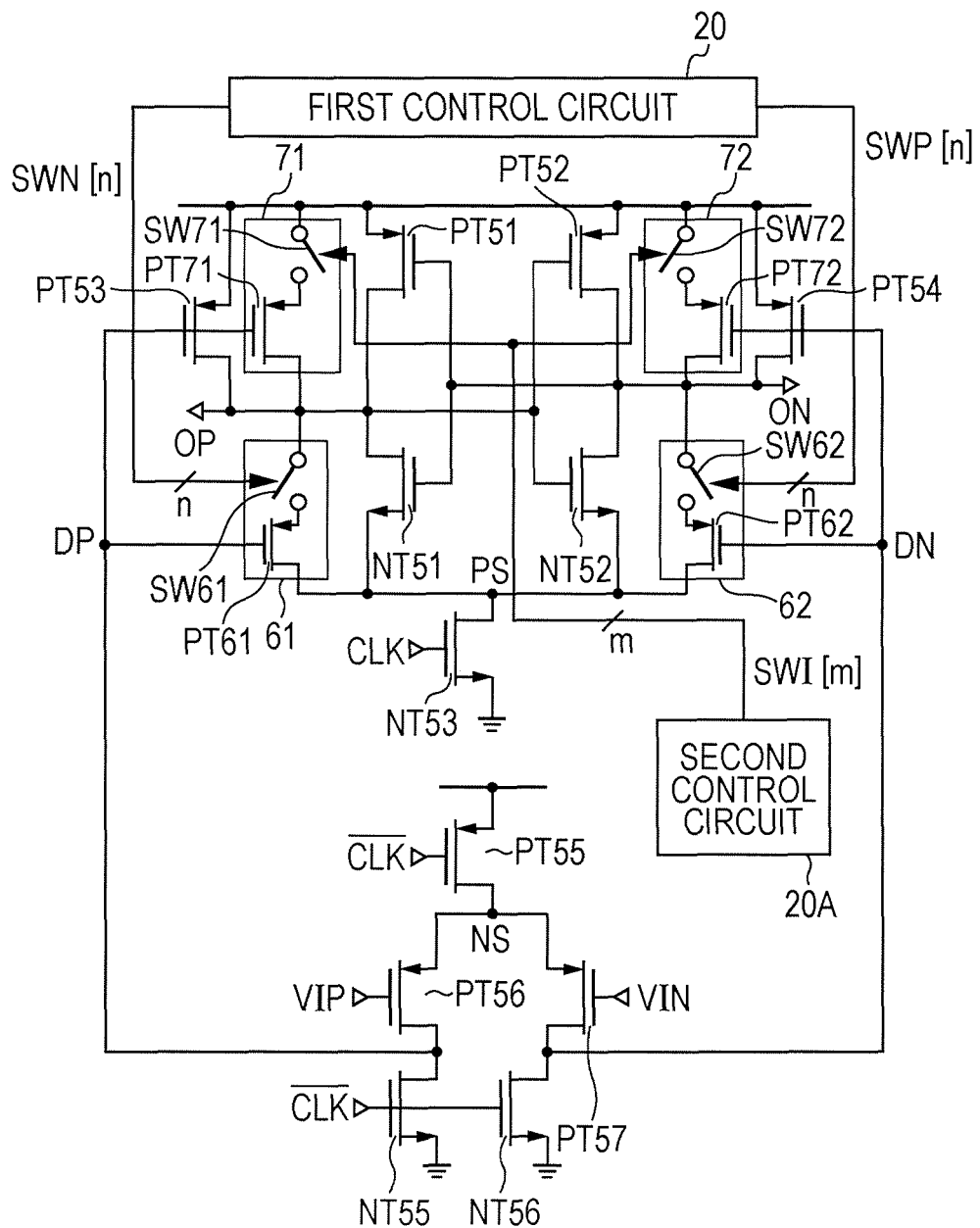
FIG. 23 is a circuit diagram of a comparator of a fourth embodiment.
Figure 24:
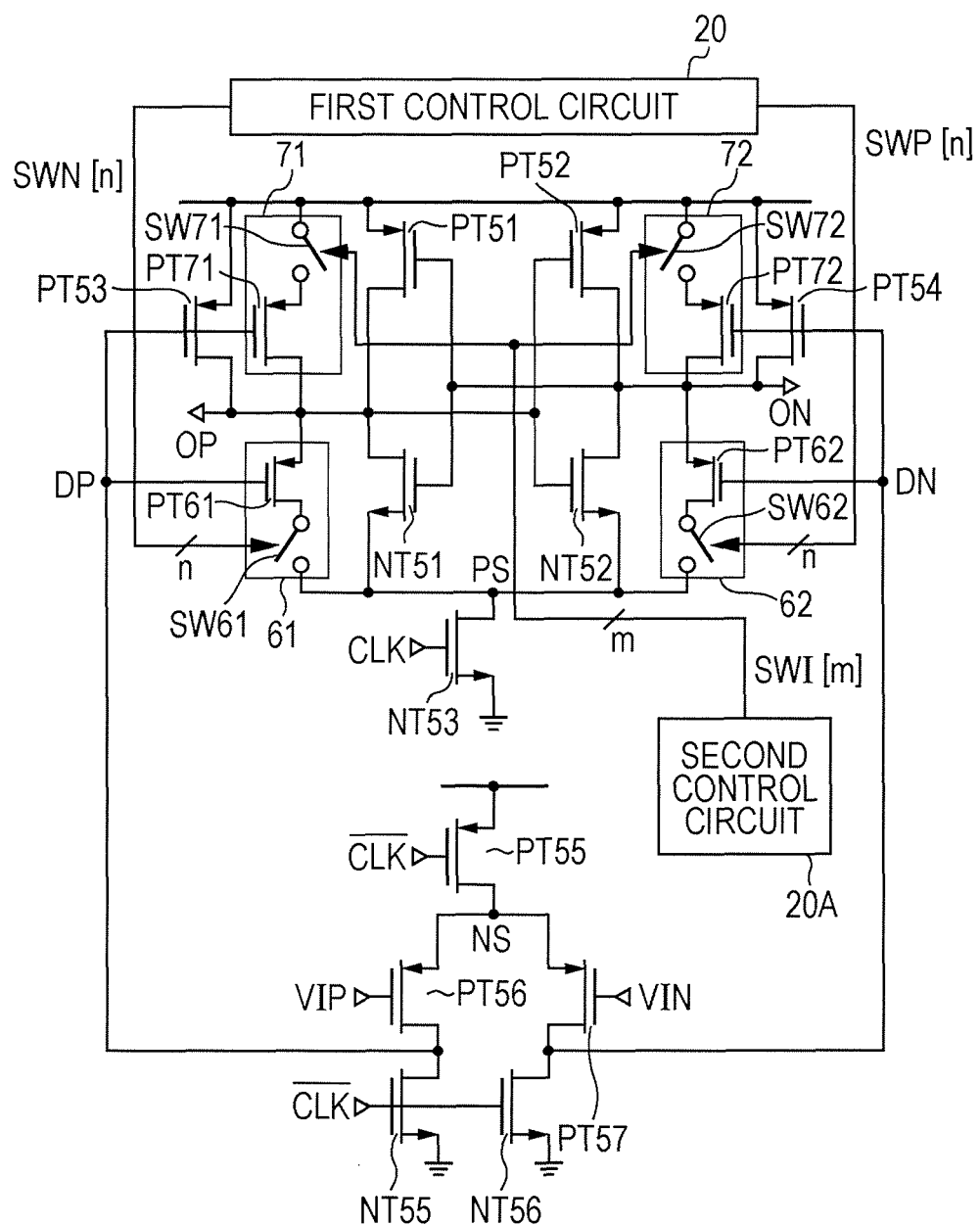
FIG. 24 is a circuit diagram of a modification of the comparator of the fourth embodiment.
Figure 25:
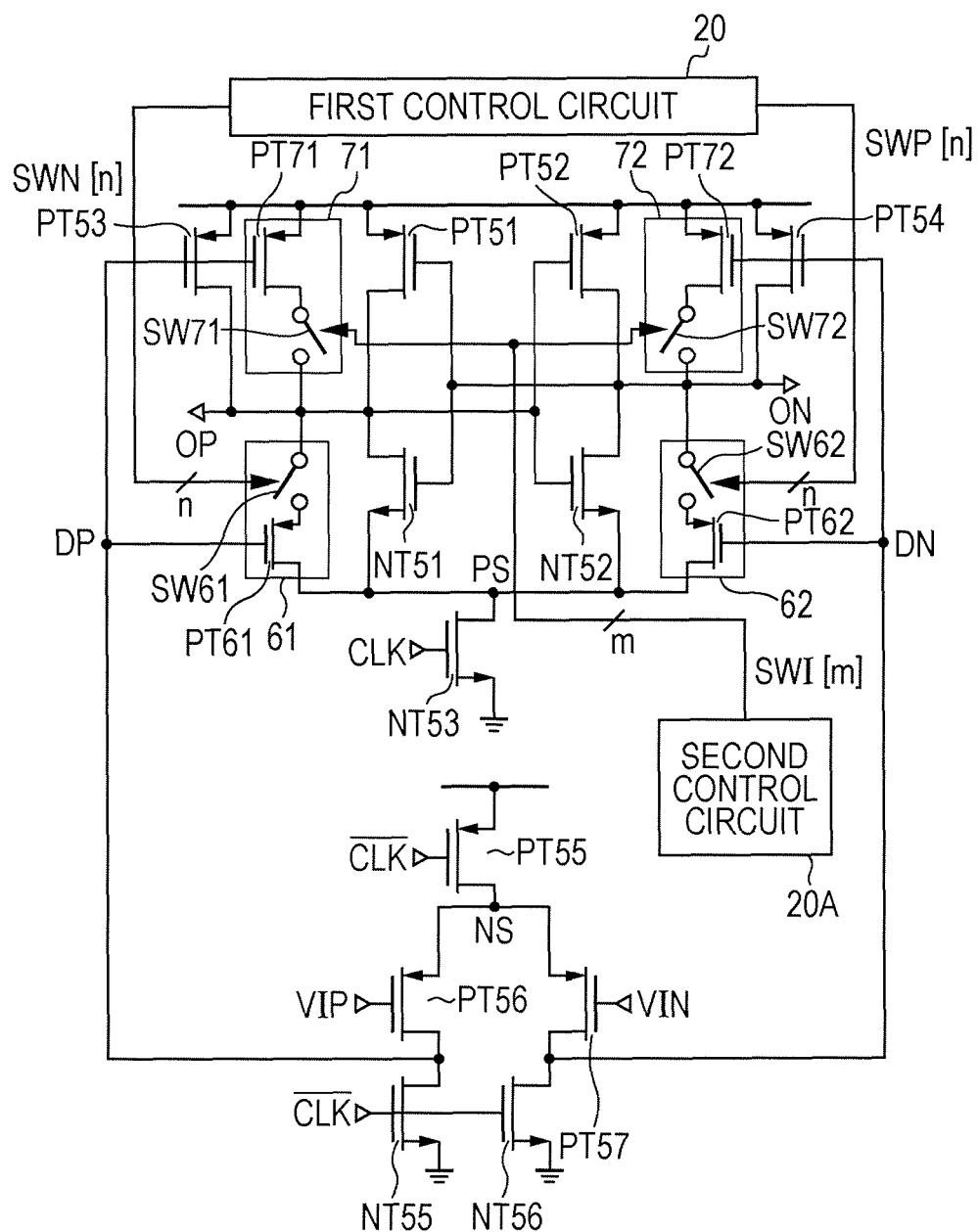
FIG. 25 is a circuit diagram of a modification of the comparator of the fourth embodiment.
Figure 26:
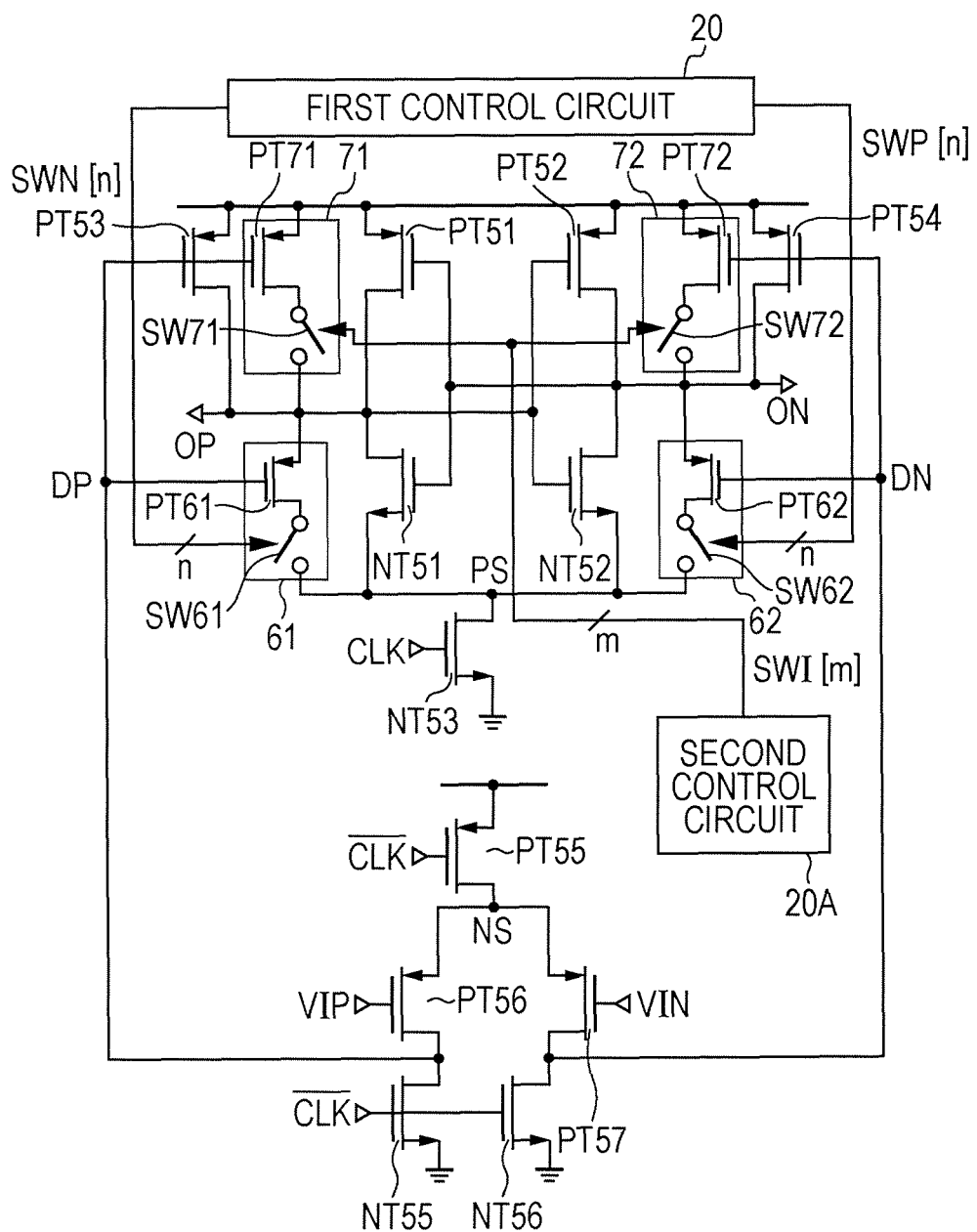
FIG. 26 is a circuit diagram of a modification of the comparator of the fourth embodiment.
Figure 27:
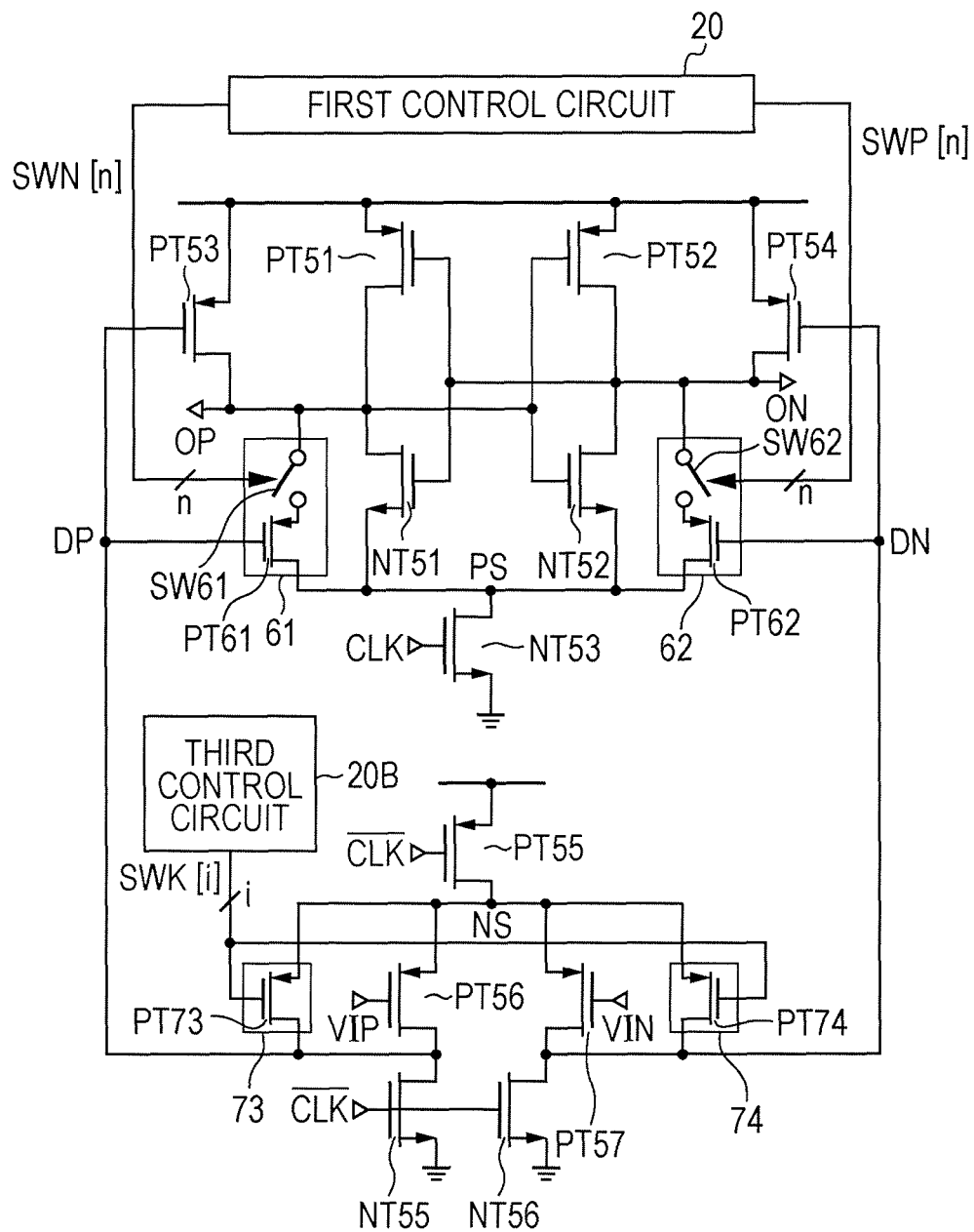
FIG. 27 is a circuit diagram of a modification of the comparator of FIG. 15.
Figure 28:
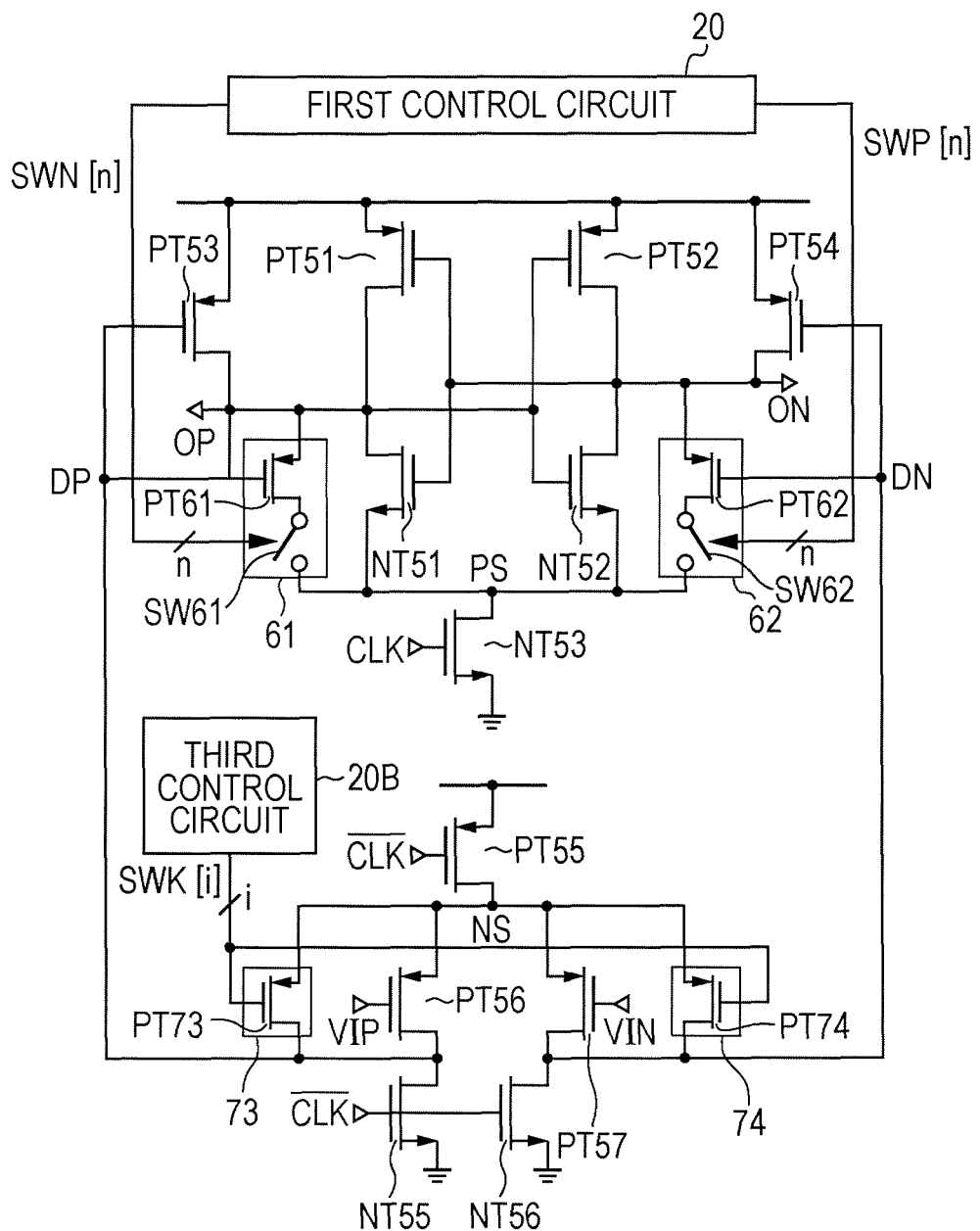
FIG. 28 is a circuit diagram of a modification of the comparator of FIG. 16.
Figure 29:
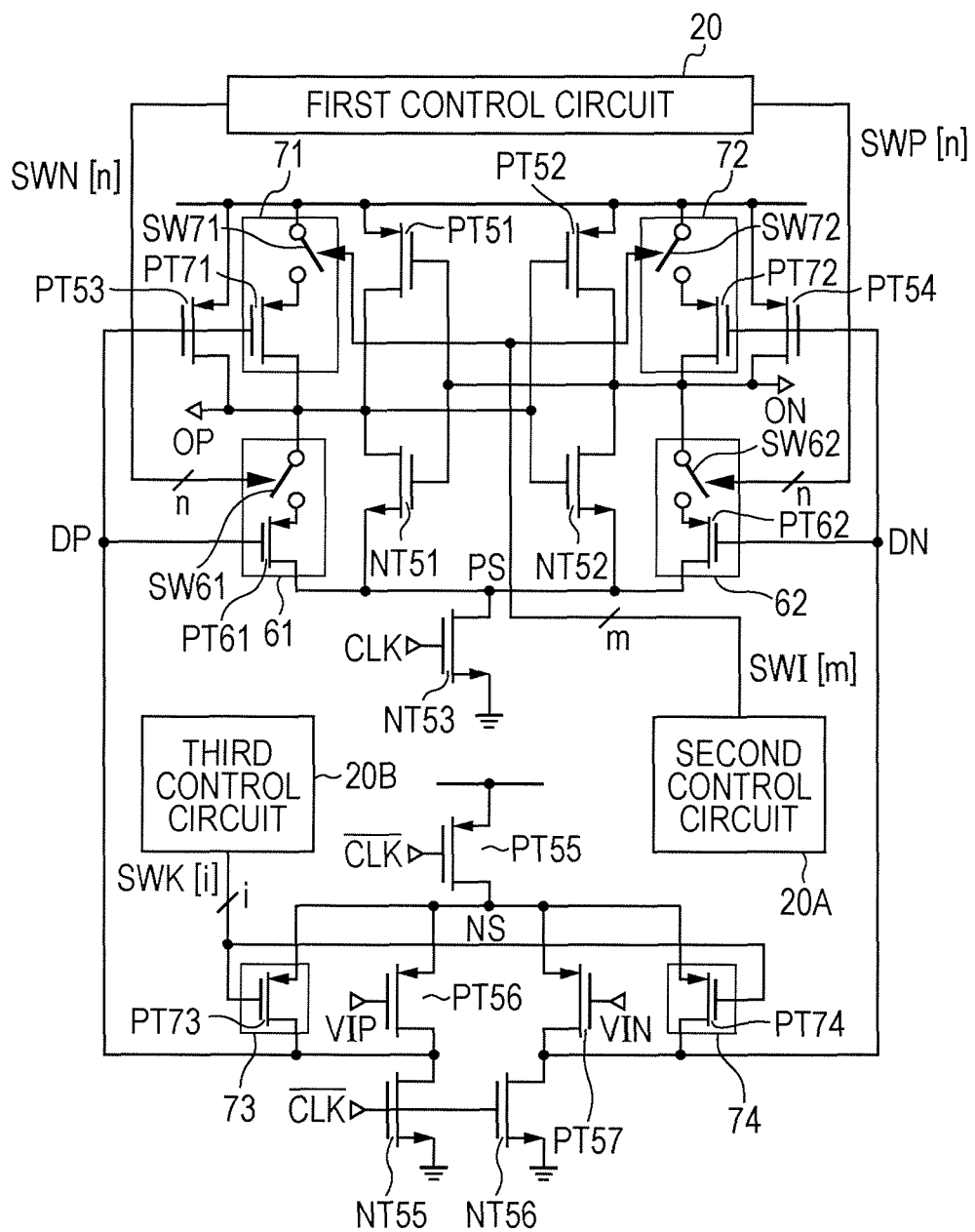
FIG. 29 is a circuit diagram of a modification of the comparator of FIG. 17.
Figure 30:
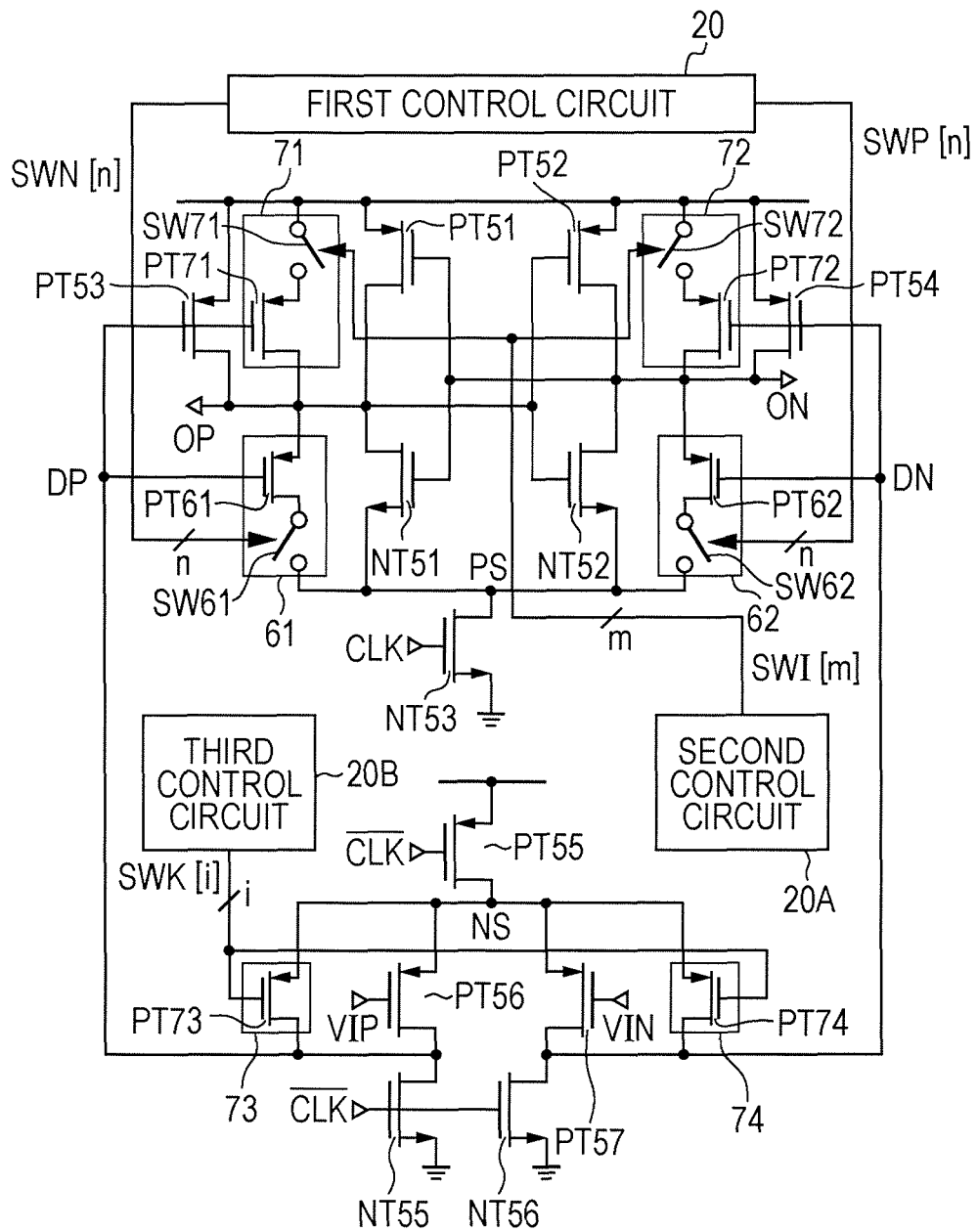
FIG. 30 is a circuit diagram of a modification of the comparator of FIG. 18.
Figure 31:
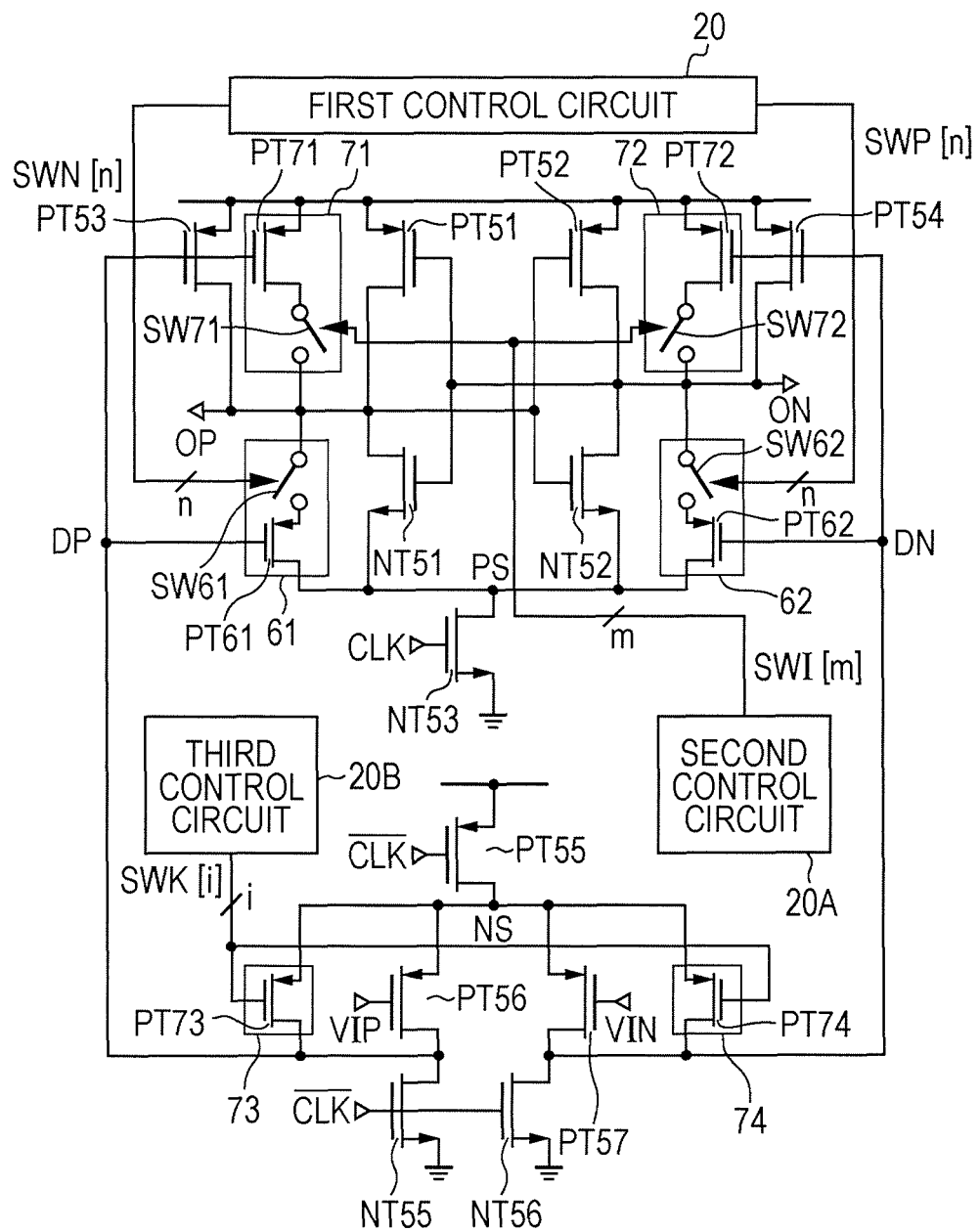
FIG. 31 is a circuit diagram of a modification of the comparator of FIG. 19.
Figure 32:
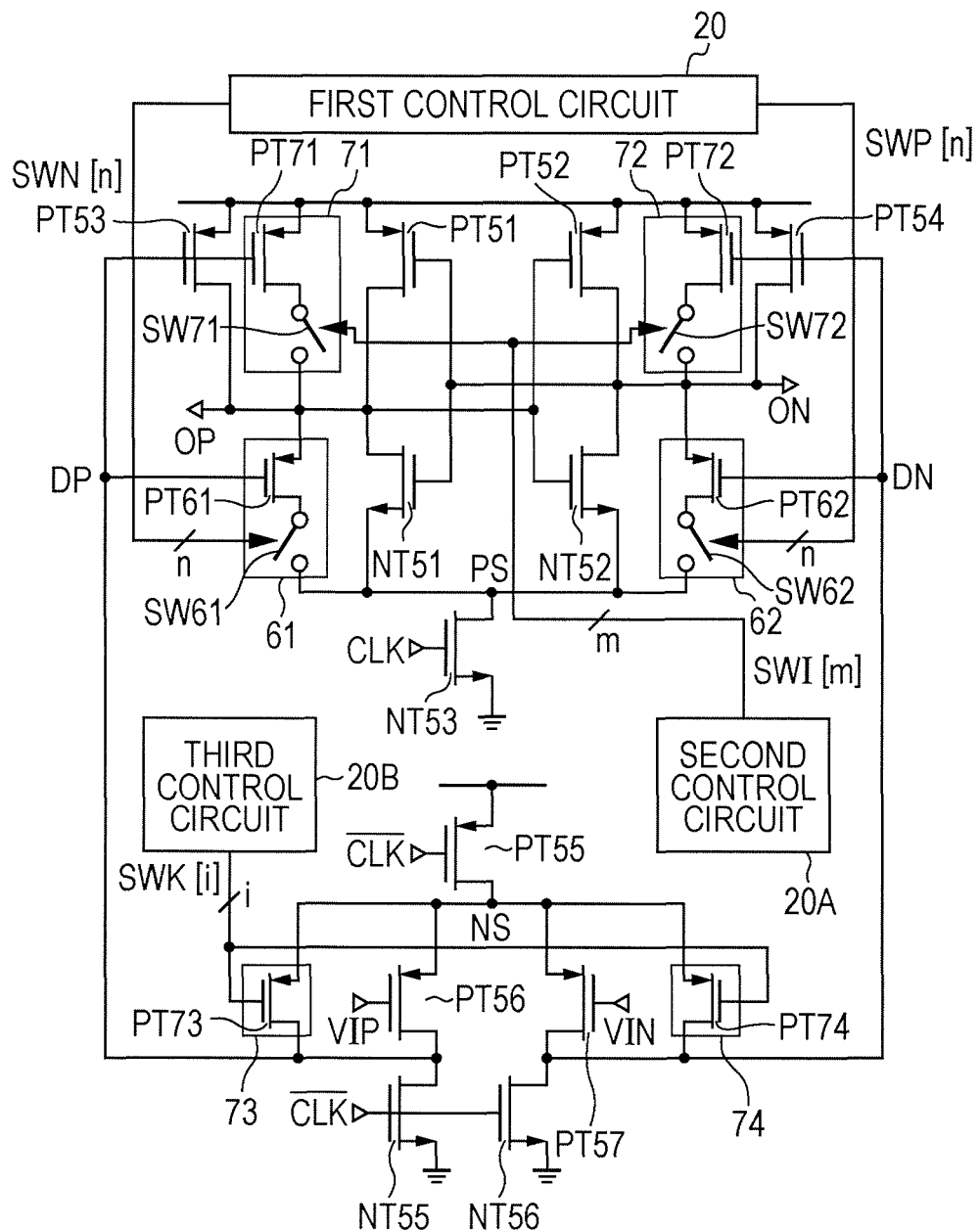
FIG. 32 is a circuit diagram of a modification of the comparator of FIG. 20.

FIG. 23 is a circuit diagram of a comparator of a fourth embodiment. The comparator of the fourth embodiment is the same as the comparator of the first embodiment except that polarity of the transistors at the tail parts of the circuits are changed. Therefore, the comparator of the fourth embodiment operates symmetrically with respect to polarity. For example, in the first embodiment, the input signals VIP and VIN are input in the gates of the NMOS transistors NT15 and NT16. In the fourth embodiment, input signals VIP and VIN are input in gates of PMOS transistors PT56 and PT57. Further, a circuit of a second stage is also changed: transistors of a first main corrector 61, a second main corrector 62, a first sub-correction circuit 71, and a second sub-correction circuit 72 are changed to PMOS transistors. Further description will be omitted. That is, the comparator of the fourth embodiment has polarity reversed from that of the comparator of the first embodiment, and operates similarly to the comparator of the first embodiment even if the polarity is reversed.

FIGS. 24 to 32 are circuit diagrams with reversed polarity in the comparators illustrated in FIGS. 12 to 20. Further description will be omitted.

Next, an embodiment in which the comparators of the first to fourth embodiments and their modifications are applied to an A/D converter will be described.

Figure 33:
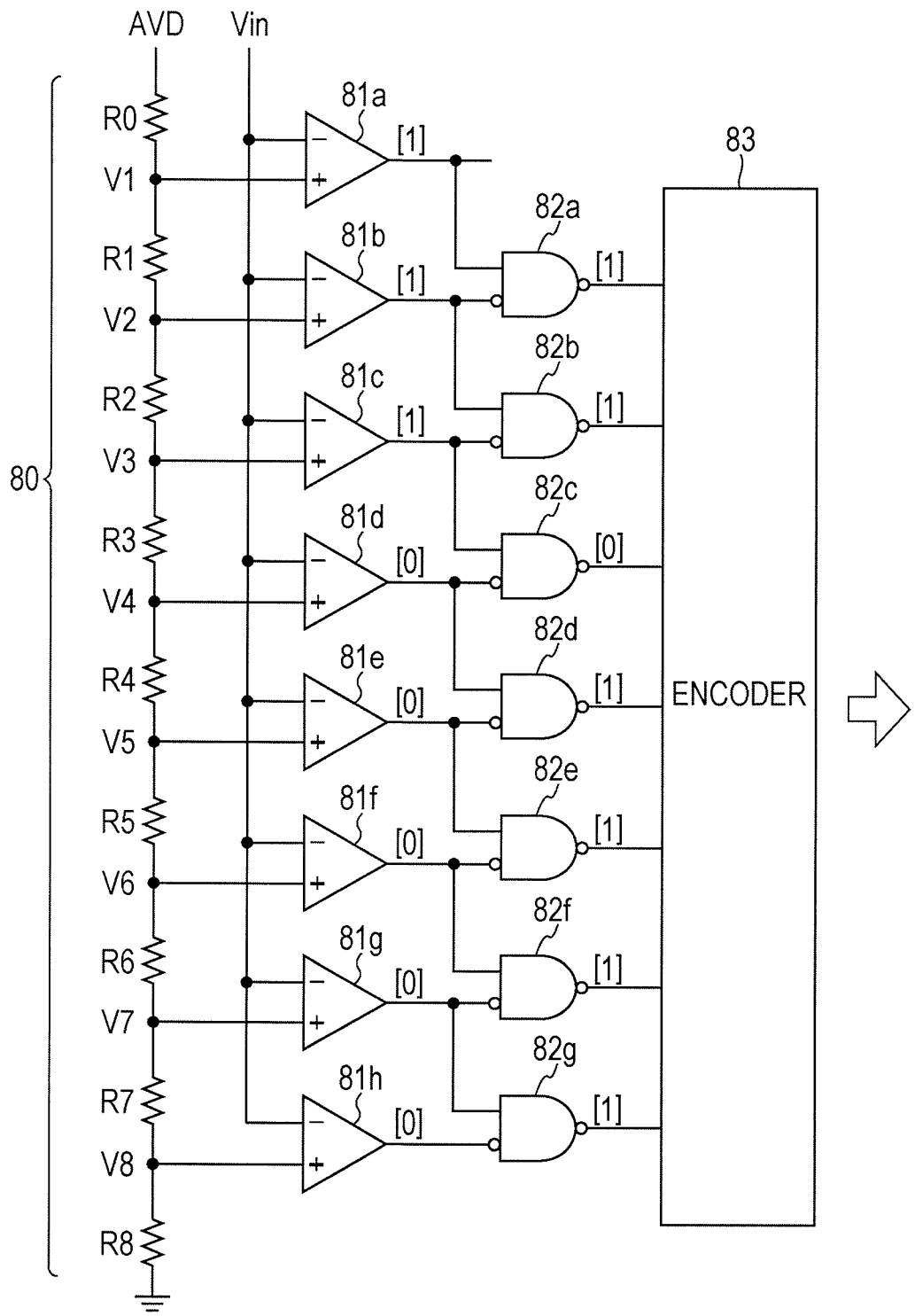
FIG. 33 is a circuit diagram of an A/D converter of a fifth embodiment.

FIG. 33 is a diagram illustrating a configuration of a 4-bit A/D converter of a fifth embodiment. The A/D converter of the fifth embodiment includes a ladder resistance 80, eight comparator circuits 81a to 81h, seven NAND gates 82a to 82g and an encoder 83. The ladder resistance 80 includes resistances R0 to R8 connected in series between high potential power supply AVD and low potential power supply GND, and obtains reference potentials V1 to V8 from connection nodes of resistances. The comparator circuits 81a to 81h are any one of the comparators of the first to fourth embodiments and their modifications. Analog signals Vin to be digitized are input as input signals VIP and reference potentials V1 to V8 are input as input signals VIN. The NAND gates 82a to 82g output H"(1) if output values of two adjacent comparators are the same and "L (0)" if output values of two adjacent comparators are different. The encoder 83 outputs encoding data representing a position becoming [0] among outputs of seven NAND gates 82a to 82g. A configuration of such an A/D converter is well-known and further description will be omitted.

Resistance values of the resistances R0 to R8 of the ladder resistance 80 are precisely set by, for example, trimming and the reference potentials V1 to V8 have voltage levels at equal intervals. Eight comparator circuits 81a to 81h are adjusted so that analog signals Vin may change when they reach the reference potentials V1 to V8, that is, so that offset becomes zero. Since a calibration operation to sequentially adjust offset of eight comparator circuits 81a to 81h is performed, it is desirable to provide a total control circuit (not illustrated) for the control of the calibration operation. The CPU 26 illustrated in FIG. 7 may perform this process.

Note that, in the comparators of the first to fourth embodiments and their modifications, the threshold may be desirably adjusted; therefore, accurate A/D conversion data may be obtained even if the resistance values of the resistances R0 to R8 are not set precisely and the reference potentials V1 to V8 does not have voltage levels at exactly equal intervals. In that case, the reference potential accurate as analog signals Vin are input sequentially, and the above-described calibration operation is performed so that the threshold of the corresponding comparator becomes each reference potential. Therefore, the resistance values of the resistances R0 to R8 do not have to be set precisely by, for example, trimming. Also in this case, it is desirable to provide a total control circuit.

Figure 34:
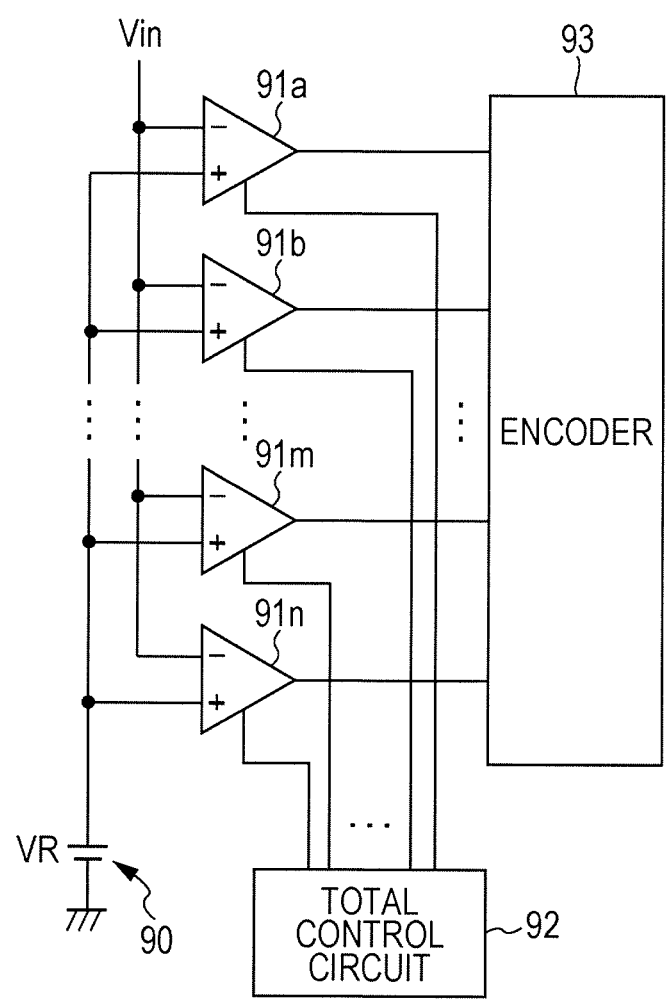
FIG. 34 is a circuit diagram of an A/D converter of a sixth embodiment.

FIG. 34 is a diagram illustrating a configuration of an A/D converter of a sixth embodiment. The A/D converter of the sixth embodiment is a circuit which deals with analog signals of a relatively narrow input range.

The A/D converter of the sixth embodiment includes a reference voltage source 90, a plurality of comparator circuits 91a to 91n, a total control circuit 92, and an encoder 93. The reference voltage source 90 outputs a single reference voltage VR. The comparator circuits 91a to 91n are any one of the comparators of the first to fourth embodiments. Analog signals Vin to be digitized are input as input signals VIP and the reference potential VR is input as an input signal VIN. The total control circuit 92 controls so that calibration operations are sequentially performed in a plurality of comparator circuits 91a to 91n. The encoder 93 generates data representing a voltage level of the analog signal Vin in accordance with the outputs of a plurality of comparator circuits 91a to 91n. The encoder 93 detects a position at which outputs of a plurality of comparator circuits 91a to 91n change, or detects a position at which outputs of a plurality of comparator circuits 91a to 91n change by a publicly known method, such as the majority rule.

The comparators of the first to fourth embodiments may adjust threshold desirably if the range is narrow. In the sixth embodiment, each of a plurality of comparator circuits 91a to 91n is set to have a threshold shifted by a predetermined width with respect to the reference voltage VR. For example, seven comparators are provided, the predetermined width is set at 30 my, and the thresholds are set, sequentially, at VR−90 my, VR−60 my, VR−30 mV, VR, VR+30 my, VR+60 my, and VR+90 mV. Therefore, a 3-bit A/D converter of which input range is VR±90 mV is implemented. Of course, the number of bits may be increased by increasing the number of comparators, and the input range may be increased by increasing the threshold adjustable range of each comparator.

Since the A/D converter of the sixth embodiment does not use a ladder resistance, the size of the circuit may be reduced. Since the A/D converter of the sixth embodiment does not use a ladder resistance in which stationary current flows, power consumption may be reduced.

Figure 35:
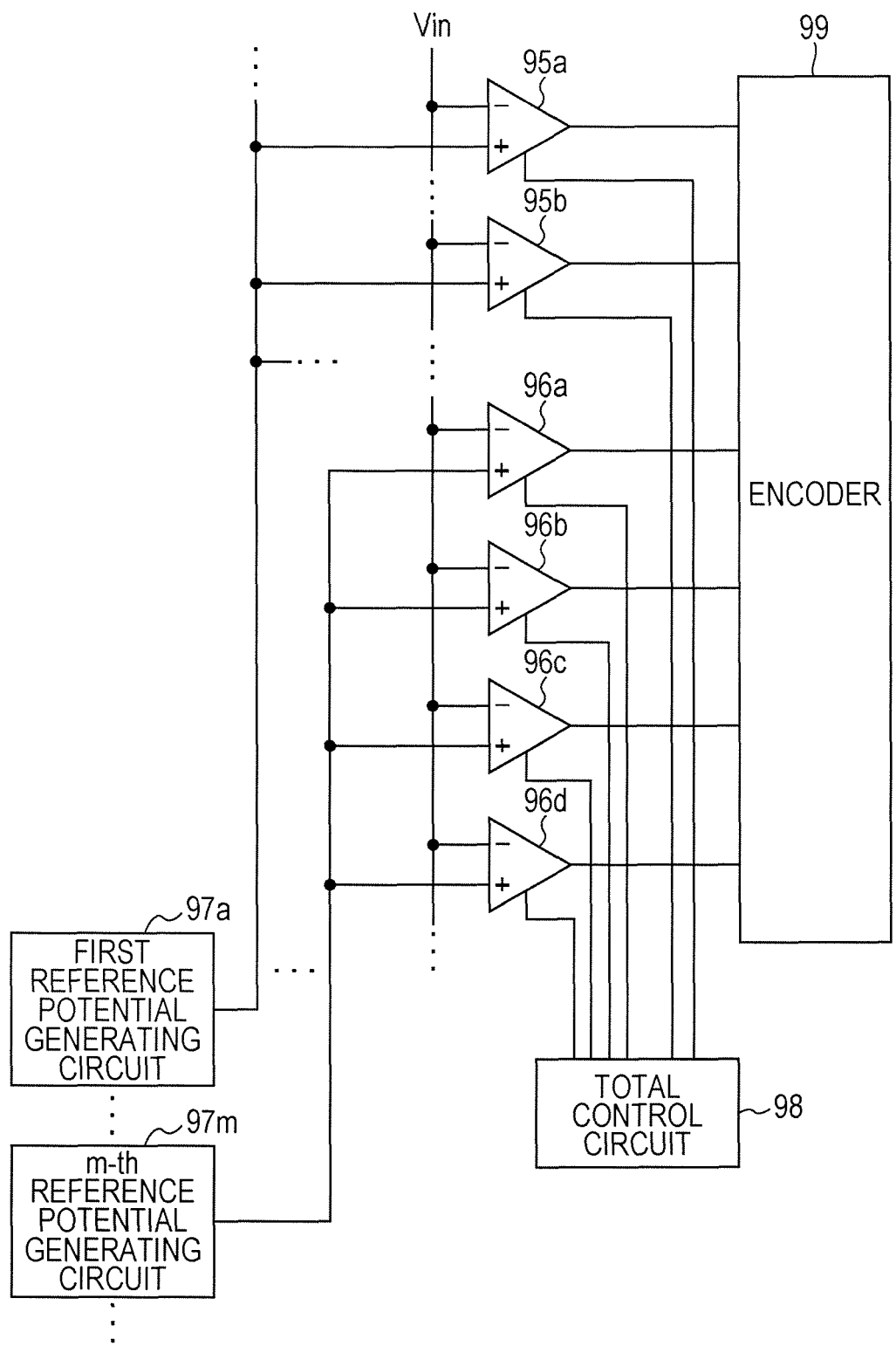
FIG. 35 is a circuit diagram of an A/D converter of a seventh embodiment.

FIG. 35 is a diagram illustrating a configuration of an A/D converter of a seventh embodiment. The A/D converter of the seventh embodiment is a circuit in which the A/D converters of the fifth and the sixth embodiments are combined together.

The A/D converter of the seventh embodiment includes a plurality of reference potential generating circuits 97a to 97m, a plurality of comparators 95a, 95b, 86a to 96d, a total control circuit 98, and an encoder 99. Since the total control circuit 98 and the encoder 99 are the same as those of the sixth embodiment, description thereof will be omitted. A plurality of reference potential generating circuits 97a to 97m generate reference potentials of which number is smaller than that of the reference potential usually used on the basis of the number of bits of the A/D converter. For example, in a case of 6-bit A/D converter, sixty three reference potentials are usually used, but herein eight reference potentials are generated. These reference potentials may be generated in a ladder resistance as in the fifth embodiment but may be generated using, for example, a D/A converter circuit.

A plurality of comparators are divided into a plurality of groups, and each group is supplied with the same reference potential as an input signal VIN. For example, as described above, in generating eight reference potentials in a 6-bit A/D converter, sixty three comparators are divided into eight groups with each group including eight comparators (only one group includes seven comparators). In each group, for a single supplied reference potential, eight comparators are set to have eight different thresholds at equal intervals. The minimum threshold and the maximum threshold of adjacent groups are set to be at equal intervals. In this manner, sixty three comparators of which thresholds change at equal intervals are obtained.

In the seventh embodiment, even if an adjustment range of threshold of each comparator is relatively narrow, A/D conversion of an analog signal of a wide input range may be performed on the whole.

Although embodiments have been described, it is to be understood that various modifications may be made. For example, a person skilled in the art may easily conceive of various modifications of the circuit configuration and various other methods regarding calibration.

Although embodiments have been described, all the examples and conditions described are provided for the purpose of helping understanding the concepts of the embodiments and techniques. In particular, the described example and conditions are not provided to limit the scope of the embodiments: configurations provided in the description are not related to advantages and defects of the embodiments. Although embodiments have been described in detail, it is to be understood that various changes, replacements, and modifications may be made without departing from the spirit and scope of the embodiments.

What is claimed is:

1. A comparator, comprising:
  a differential amplifier of which operational state is switched in response to a clock signal, and which outputs a first intermediate output corresponding to a first input signal and a second intermediate output corresponding to a second input signal;
  a differential latch circuit of which operational state is switched in response to the clock signal, and a state of which is changed depending on the first intermediate output and the second intermediate output;
  a first adjuster configured to adjust a threshold of the differential latch circuit with respect to a change of a state of the first intermediate output and a change of a state of the second intermediate output; and
  a second adjuster configured to adjust a threshold variation of the differential latch circuit with respect to a change of a state of the first intermediate output and a change of a state of the second intermediate output.

2. The comparator according to claim 1, wherein:
  the differential latch circuit includes
    a latch circuit which includes a first line including a first PMOS transistor and a first NMOS transistor which are connected in series, and a second line which is connected in parallel to the first line and which includes a second PMOS transistor and a second NMOS transistor which are connected in series, gates of the first PMOS transistor and the first NMOS transistor being connected to a connection node of the second PMOS transistor and the second NMOS transistor, and gates of the second PMOS transistor and the second NMOS transistor being connected to a connection node of the first PMOS transistor and the first NMOS transistor,
    a third PMOS transistor which is connected between sources of the first PMOS transistor and the second PMOS transistor and a high potential power supply, an inversion signal of the clock being applied to a gate of the third PMOS transistor,
    a first intermediate input NMOS transistor connected in parallel to the first NMOS transistor, and
    a second intermediate input NMOS transistor connected in parallel to the second NMOS transistor;
  a comparison result is output from the connection node of the first PMOS transistor and the first NMOS transistor and from the connection node of the second PMOS transistor and the second NMOS transistor;
  the differential amplifier includes
    an amplifier which includes a third line which includes a fourth PMOS transistor and a fourth NMOS transistor which are connected in series, and a fourth line which is connected in parallel to the third line and which includes a fifth PMOS transistor and a fifth NMOS transistor which are connected in series, and
    a sixth NMOS transistor which is connected between sources of the fourth NMOS transistor and the fifth NMOS transistor and a low potential power supply, a clock being applied to a gate of the sixth NMOS transistor;
  the first input signal is applied to a gate of the fourth NMOS transistor;
  the second input signal is applied to a gate of the fifth NMOS transistor; and
  the first intermediate output is output from a connection node of the fourth PMOS transistor and the fourth NMOS transistor, and the second intermediate output is output from a connection node of the fifth PMOS transistor and the fifth NMOS transistor.

3. The comparator according to claim 2, wherein:
  the first adjuster includes
    a plurality of first adjustment NMOS transistors which are connected in parallel to the first PMOS transistor and the number of which to be connected is controllable,
    a plurality of second adjustment NMOS transistors which are connected in parallel to the second PMOS transistor and the number of which to be connected is controllable, and
    a first control circuit;
  the first intermediate output is applied to a gate of the first intermediate input NMOS transistor and gates of the plurality of first adjustment NMOS transistors;

the second intermediate output is applied to a gate of the second intermediate input NMOS transistor and gates of the plurality of second adjustment NMOS transistors; and the first control circuit controls the number of the plurality of first adjustment NMOS transistors to be connected and the number of the plurality of second adjustment NMOS transistor to be connected.

4. The comparator according to claim 3, wherein:
each of the plurality of first adjustment NMOS transistors is connected in series to a switch which is controlled by the first control circuit, and the line in which the first adjustment NMOS transistor and the switch are connected in series is connected in parallel to the first PMOS transistor; and
each of the plurality of second adjustment NMOS transistors is connected in series to a switch which is controlled by the first control circuit, and the line in which the second adjustment NMOS transistor and the switch are connected in series is connected in parallel to the second PMOS transistor.

5. The comparator according to claim 2, wherein:
the second adjuster includes
a plurality of third adjustment NMOS transistors which are connected in parallel to the first NMOS transistor and the number of which to be connected is controllable,
a plurality of fourth adjustment NMOS transistors which are connected in parallel to the second NMOS transistor and the number of which to be connected is controllable, and
a second control circuit;
the first intermediate output is applied to gates of the plurality of third adjustment NMOS transistors;
the second intermediate output is applied to gates of the plurality of fourth adjustment NMOS transistors; and
the second control circuit controls the number of the plurality of third adjustment NMOS transistors to be connected and the number of the plurality of fourth adjustment NMOS transistors to be connected.

6. The comparator according to claim 5, wherein:
each of the plurality of third adjustment NMOS transistors is connected in series to a switch which is controlled by the second control circuit, and the line in which the third adjustment NMOS transistor and the switch are connected in series is connected in parallel to the first NMOS transistor; and
each of the plurality of fourth adjustment NMOS transistors is connected in series to a switch which is controlled by the second control circuit, and the line in which the fourth adjustment NMOS transistor and the switch are connected in series is connected in parallel to the second NMOS transistor.

7. The comparator according to claim 5, wherein:
the second adjuster further includes
a plurality of fifth adjustment NMOS transistors which are connected in parallel to the fourth NMOS transistor and the number of which to be connected is controllable,
a plurality of sixth adjustment NMOS transistors which are connected in parallel to the fifth NMOS transistor and the number of which to be connected is controllable, and,
a third control circuit; and
the third control circuit controls the number of the plurality of fifth adjustment NMOS transistors to be connected and the number of the plurality of sixth adjustment NMOS transistors to be connected.

8. The comparator according to claim 2, wherein:
the second adjuster includes
a plurality of fifth adjustment NMOS transistors which are connected in parallel to the fourth NMOS transistor and the number of which to be connected is controllable,
a plurality of sixth adjustment NMOS transistors which are connected in parallel to the fifth NMOS transistor and the number of which to be connected is controllable, and
a third control circuit; and
the third control circuit controls the number of the plurality of fifth adjustment NMOS transistors to be connected and the number of the plurality of sixth adjustment NMOS transistors to be connected.

9. The comparator according to claim 1, wherein:
the differential latch circuit includes
a latch circuit which includes a first line including a first PMOS transistor and a first NMOS transistor which are connected in series, and a second line which is connected in parallel to the first line and which includes a second PMOS transistor and a second NMOS transistor which are connected in series, gates of the first PMOS transistor and the first NMOS transistor being connected to a connection node of the second PMOS transistor and the second NMOS transistor, and gates of the second PMOS transistor and the second NMOS transistor being connected to a connection node of the first PMOS transistor and the first NMOS transistor,
a third NMOS transistor which is connected between sources of the first NMOS transistor and the second NMOS transistor and a low potential power supply, a clock being applied to a gate of the third NMOS transistor,
a first intermediate input PMOS transistor connected in parallel to the first PMOS transistor, and
a second intermediate input PMOS transistor connected in parallel to the second PMOS transistor;
a comparison result is output from the connection node of the first PMOS transistor and the first NMOS transistor and from the connection node of the second PMOS transistor and the second NMOS transistor;
the differential amplifier includes
an amplifier which includes a third line which includes a fourth PMOS transistor and a fourth NMOS transistor which are connected in series, and a fourth line which is connected in parallel to the third line and which includes a fifth PMOS transistor and a fifth NMOS transistor which are connected in series, and
a sixth PMOS transistor which is connected between sources of the fourth PMOS transistor and the fifth PMOS transistor and a high potential power supply, an inversion signal of the clock being applied to a gate of the sixth PMOS transistor;
the first input signal is applied to a gate of the fourth PMOS transistor;
the second input signal is applied to a gate of the fifth PMOS transistor; and
the first intermediate output is output from a connection node of the fourth PMOS transistor and the fourth NMOS transistor, and the second intermediate output is output from a connection node of the fifth PMOS transistor and the fifth NMOS transistor.

10. The comparator according to claim 9, wherein:
the first adjuster includes
- a plurality of first adjustment PMOS transistors which are connected in parallel to the first NMOS transistor and the number of which to be connected is controllable,
- a plurality of second adjustment NMOS transistors which are connected in parallel to the second NMOS transistor and the number of which to be connected is controllable, and
- a first control circuit;

the first intermediate output is applied to a gate of the first intermediate input PMOS transistor and gates of the plurality of first adjustment PMOS transistors;
the second intermediate output is applied to a gate of the second intermediate input PMOS transistor and gates of the plurality of second adjustment PMOS transistors; and
the first control circuit controls the number of the plurality of first adjustment PMOS transistors to be connected and the number of the plurality of second adjustment PMOS transistors to be connected.

11. The comparator according to claim 10, wherein:
each of the plurality of first adjustment PMOS transistors is connected in series to a switch which is controlled by the first control circuit, and the line in which the first adjustment PMOS transistor and the switch are connected in series is connected in parallel to the first NMOS transistor; and
each of the plurality of second adjustment PMOS transistors is connected in series to a switch which is controlled by the first control circuit, and the line in which the second adjustment PMOS transistor and the switch are connected in series is connected in parallel to the second NMOS transistor.

12. The comparator according to claim 9, wherein:
the second adjuster includes
- a plurality of third adjustment PMOS transistors which are connected in parallel to the first PMOS transistor and the number of which to be connected is controllable,
- a plurality of fourth adjustment PMOS transistors which are connected in parallel to the second PMOS transistor and the number of which to be connected is controllable, and
- a second control circuit;

the first intermediate output is applied to gates of the plurality of third adjustment PMOS transistors;
the second intermediate output is applied to gates of the plurality of fourth adjustment PMOS transistors; and
the second control circuit controls the number of the plurality of third adjustment PMOS transistors to be connected and the number of the plurality of fourth adjustment PMOS transistors to be connected.

13. The comparator according to claim 12, wherein:
each of the plurality of third adjustment PMOS transistors is connected in series to a switch which is controlled by the second control circuit, and the line in which the third adjustment PMOS transistor and the switch are connected in series is connected in parallel to the first PMOS transistor; and
each of the plurality of fourth adjustment PMOS transistors is connected in series to a switch which is controlled by the second control circuit, and the line in which the fourth adjustment PMOS transistor and the switch are connected in series is connected in parallel to the second PMOS transistor.

14. The comparator according to claim 12, wherein:
the second adjuster further includes
- a plurality of fifth adjustment PMOS transistors which are connected in parallel to the fourth PMOS transistor and the number of which to be connected is controllable,
- a plurality of sixth adjustment PMOS transistors which are connected in parallel to the fifth PMOS transistor and the number of which to be connected is controllable, and
- a third control circuit; and the third control circuit controls the number of the plurality of fifth adjustment PMOS transistors to be connected and the number of the plurality of sixth adjustment PMOS transistors to be connected.

15. The comparator according to claim 9, wherein:
the second adjuster includes
- a plurality of fifth adjustment PMOS transistors which are connected in parallel to the fourth PMOS transistor and the number of which to be connected is controllable,
- a plurality of sixth adjustment PMOS transistors which are connected in parallel to the fifth PMOS transistor and the number of which to be connected is controllable, and
- a third control circuit; and the third control circuit controls the number of the plurality of fifth adjustment PMOS transistors to be connected and the number of the plurality of sixth adjustment PMOS transistors to be connected.

16. An analog-to-digital converter, comprising:
a plurality of comparators having thresholds which vary in stages; and
a processing circuit configured to generate digital data corresponding to voltage of an analog input signal in accordance with a comparison result of the plurality of comparators with respect to the analog input signal, wherein
each of the plurality of comparators includes
- a differential amplifier of which operational state is switched in response to a clock signal, and which outputs a first intermediate output corresponding to a first input signal and a second intermediate output corresponding to a second input signal,
- a differential latch circuit of which operational state is switched in response to the clock signal, and a state of which is changed depending on the first intermediate output and the second intermediate output,
- a first adjuster configured to independently adjust sensitivity of the differential latch circuit with respect to a change of a state of the first intermediate output and a change of a state of the second intermediate output, and
- a second adjuster configured to collectively adjust sensitivity of the differential latch circuit with respect to a change of a state of the first intermediate output and a change of a state of the second intermediate output.

* * * * *